US010957561B2

(12) United States Patent
Drewery et al.

(10) Patent No.: US 10,957,561 B2
(45) Date of Patent: Mar. 23, 2021

(54) GAS DELIVERY SYSTEM

(71) Applicant: Lam Research Corporation, Fremont, CA (US)

(72) Inventors: John Drewery, San Jose, CA (US); Yoshie Kimura, Castro Valley, CA (US); James Adams, Union City, CA (US); Yoko Yamaguchi Adams, Union City, CA (US); Tony Zemlock, Tracy, CA (US)

(73) Assignee: Lam Research Corporation, Fremont, CA (US)

( * ) Notice: Subject to any disclaimer, the term of this patent is extended or adjusted under 35 U.S.C. 154(b) by 594 days.

(21) Appl. No.: 14/945,680

(22) Filed: Nov. 19, 2015

(65) Prior Publication Data

US 2017/0032982 A1   Feb. 2, 2017

Related U.S. Application Data

(60) Provisional application No. 62/199,031, filed on Jul. 30, 2015.

(51) Int. Cl.
*H01L 21/67* (2006.01)
*H01J 37/32* (2006.01)
(Continued)

(52) U.S. Cl.
CPC .. *H01L 21/67017* (2013.01); *C23C 16/45512* (2013.01); *C23C 16/45561* (2013.01);
(Continued)

(58) Field of Classification Search
CPC ... C23C 14/544; C23C 16/301; C23C 16/303; C23C 16/4482; C23C 16/45512;
(Continued)

(56) References Cited

U.S. PATENT DOCUMENTS 3,534,753 A * 10/1970 Ollivier ................ G05D 11/035
                                                          137/7
4,262,686 A *  4/1981 Heim ..................... A61M 16/12
                                                          137/101.19
(Continued)

FOREIGN PATENT DOCUMENTS

CN           102243977 A      11/2011
CN           102315150 A       1/2012
(Continued)

OTHER PUBLICATIONS

U.S. Pat. No. 6,210,6407: filed Jan. 22, 2015, in the names of Joseph Yudovsky et al., & entitled "Injector for Spatially Separated Atomic Layer Deposition Chamber" pp. 1-68. (Year: 2015).*
(Continued)

*Primary Examiner* — Jeffrie R Lund
*Assistant Examiner* — Stanislav Antolin

(57) ABSTRACT

A gas delivery system for a substrate processing system includes a first manifold and a second manifold. A gas delivery sub-system selectively delivers gases from gas sources. The gas delivery sub-system delivers a first gas mixture to the first manifold and a second gas mixture. A gas splitter includes an inlet in fluid communication with an outlet of the second manifold, a first outlet in fluid communication with an outlet of the first manifold, and a second outlet. The gas splitter splits the second gas mixture into a first portion at a first flow rate that is output to the first outlet and a second portion at a second flow rate that is output to the second outlet. First and second zones of the substrate processing system are in fluid communication with the first and second outlets of the gas splitter, respectively.

55 Claims, 14 Drawing Sheets

(51) Int. Cl.
*C23C 16/455* (2006.01)
*C30B 25/16* (2006.01)

(52) U.S. Cl.
CPC ...... *C23C 16/45574* (2013.01); *C30B 25/165* (2013.01); *H01J 37/3244* (2013.01); *H01J 37/32449* (2013.01); *C23C 16/455* (2013.01); *C23C 16/45563* (2013.01); *C23C 16/45565* (2013.01); *H01J 2237/332* (2013.01); *H01J 2237/334* (2013.01); *H01J 2237/335* (2013.01); *H01J 2237/336* (2013.01)

(58) Field of Classification Search
CPC ........ C23C 16/45514; C23C 16/45517; C23C 16/45523; C23C 16/455–4551; C23C 16/45548; C23C 16/45457; C23C 16/45561; C23C 16/45563; C23C 16/45565; C23C 16/45574; C23C 16/45578; C23C 16/52; C30B 25/08; C30B 25/14; C30B 25/16–165; G05D 11/001–008; G05D 11/00–16; G05D 11/02–139; G05D 11/132–134; G05D 7/06–0694; G05D 7/0676–0682; H01J 37/3244; H01J 11/32449; H01J 21/00; H01J 21/67017; H01J 21/07069; H01J 21/6719; Y10T 137/265–3665; Y10T 137/2668–2698

See application file for complete search history.

(56) References Cited

U.S. PATENT DOCUMENTS

| | | | |
|---|---|---|---|
| 4,374,698 A | 2/1983 | Sanders et al. | |
| 4,431,477 A | 2/1984 | Zajac | |
| 4,793,897 A | 12/1988 | Dunfield et al. | |
| 5,220,515 A * | 6/1993 | Freerks | H01L 21/67017 702/47 |
| 5,329,965 A * | 7/1994 | Gordon | G05D 7/0652 137/599.07 |
| 5,413,145 A * | 5/1995 | Rhyne | F15D 1/0005 138/40 |
| 5,520,969 A * | 5/1996 | Nishizato | C23C 16/4481 427/248.1 |
| 5,605,179 A * | 2/1997 | Strong, Jr. | F16K 27/003 137/240 |
| 5,660,673 A | 8/1997 | Miyoshi | |
| 5,662,143 A * | 9/1997 | Caughran | C23C 16/52 137/269 |
| 5,683,517 A * | 11/1997 | Shan | C23C 16/455 118/723 E |
| 5,702,530 A * | 12/1997 | Shan | C23C 16/452 118/723 MP |
| 5,744,695 A * | 4/1998 | Forbes | G01F 25/003 73/1.35 |
| 5,762,714 A | 6/1998 | Mohn et al. | |
| 5,907,221 A | 5/1999 | Sato et al. | |
| 6,022,809 A | 2/2000 | Fan | |
| 6,042,687 A | 3/2000 | Singh et al. | |
| 6,044,534 A | 4/2000 | Seo et al. | |
| 6,050,283 A * | 4/2000 | Hoffman | G05D 11/135 137/3 |
| 6,060,400 A | 5/2000 | Oehrlein et al. | |
| 6,062,256 A * | 5/2000 | Miller | F16K 31/004 137/487.5 |
| 6,074,959 A | 6/2000 | Wang et al. | |
| 6,152,168 A * | 11/2000 | Ohmi | G05D 7/0647 137/486 |
| 6,206,976 B1 | 3/2001 | Crevasse et al. | |
| 6,210,593 B1 | 4/2001 | Ohkuni et al. | |
| 6,217,937 B1 * | 4/2001 | Shealy | C23C 16/44 118/712 |
| 6,294,466 B1 * | 9/2001 | Chang | C23C 16/4401 438/680 |
| 6,376,386 B1 | 4/2002 | Oshima | |
| 6,492,774 B1 | 12/2002 | Han et al. | |
| 6,589,352 B1 | 7/2003 | Yudovsky et al. | |
| 6,736,931 B2 | 5/2004 | Collins et al. | |
| 6,744,212 B2 | 6/2004 | Fischer et al. | |
| 6,818,560 B1 | 11/2004 | Koshimizu et al. | |
| 6,841,943 B2 | 1/2005 | Vahedi et al. | |
| 6,896,765 B2 | 5/2005 | Steger | |
| 6,898,558 B2 | 5/2005 | Klekotka | |
| 6,962,879 B2 | 11/2005 | Zhu et al. | |
| 7,129,171 B2 | 10/2006 | Zhu et al. | |
| 7,288,482 B2 | 10/2007 | Panda et al. | |
| 7,309,646 B1 | 12/2007 | Heo et al. | |
| 7,338,907 B2 | 3/2008 | Li et al. | |
| 7,757,541 B1 * | 7/2010 | Monkowski | G01N 21/68 73/1.34 |
| 7,758,698 B2 | 7/2010 | Bang et al. | |
| 7,968,469 B2 | 6/2011 | Collins et al. | |
| 8,137,463 B2 | 3/2012 | Liu et al. | |
| 8,291,935 B1 * | 10/2012 | Merritt | F16K 27/003 137/597 |
| 8,552,334 B2 | 10/2013 | Tappan et al. | |
| 8,555,920 B2 * | 10/2013 | Hirata | G05D 7/0664 137/599.07 |
| 8,592,328 B2 | 11/2013 | Hausmann et al. | |
| 8,889,024 B2 | 11/2014 | Watanabe et al. | |
| 8,956,980 B1 | 2/2015 | Chen et al. | |
| 8,999,106 B2 | 4/2015 | Liu et al. | |
| 9,011,637 B2 | 4/2015 | Yamamoto | |
| 9,051,647 B2 | 6/2015 | Cooperberg et al. | |
| 9,059,678 B2 | 6/2015 | Long et al. | |
| 9,142,391 B2 | 9/2015 | Yamamoto | |
| 9,318,343 B2 | 4/2016 | Ranjan et al. | |
| 9,471,065 B2 * | 10/2016 | Koyomogi | C23C 16/4405 118/723 I |
| 9,640,409 B1 | 5/2017 | Yang et al. | |
| 10,591,934 B2 * | 3/2020 | Gopalakrishnan | G01N 9/32 |
| 2001/0002581 A1 * | 6/2001 | Nishikawa | C23C 16/455 118/715 |
| 2001/0004903 A1 * | 6/2001 | Ohmi | G05D 7/0658 137/613 |
| 2001/0013363 A1 * | 8/2001 | Kitayama | C23C 16/44 137/7 |
| 2001/0035530 A1 * | 11/2001 | Udagawa | C23C 16/455 257/79 |
| 2002/0038669 A1 * | 4/2002 | Yamagishi | G05D 11/132 137/118.04 |
| 2002/0042205 A1 * | 4/2002 | McMillin | C23F 4/00 438/710 |
| 2002/0045265 A1 * | 4/2002 | Bergh | B01J 4/00 436/37 |
| 2002/0046991 A1 | 4/2002 | Smith et al. | |
| 2002/0048536 A1 * | 4/2002 | Bergh | B01J 4/00 422/130 |
| 2002/0072240 A1 | 6/2002 | Koike | |
| 2002/0088542 A1 | 7/2002 | Nishikawa et al. | |
| 2002/0160125 A1 | 10/2002 | Johnson et al. | |
| 2002/0174905 A1 * | 11/2002 | Latino | F15B 13/0814 137/884 |
| 2002/0175144 A1 | 11/2002 | Hung et al. | |
| 2003/0003696 A1 * | 1/2003 | Gelatos | C23C 16/4405 438/485 |
| 2003/0116195 A1 * | 6/2003 | Weissgerber | G01N 30/36 137/487.5 |
| 2003/0130807 A1 * | 7/2003 | Ambrosina | G01F 1/68 702/45 |
| 2003/0201069 A1 | 10/2003 | Johnson | |
| 2003/0213560 A1 * | 11/2003 | Wang | H01L 21/67017 156/345.31 |
| 2003/0230239 A1 * | 12/2003 | Shan | C23C 16/45561 118/715 |
| 2003/0236592 A1 * | 12/2003 | Shajii | G01F 1/684 700/282 |
| 2003/0236638 A1 * | 12/2003 | Shajii | G01F 1/6847 702/45 |

(56) References Cited

U.S. PATENT DOCUMENTS

| | | | |
|---|---|---|---|
| 2003/0236643 A1* | 12/2003 | Shajii | G01F 1/684 702/100 |
| 2004/0007176 A1* | 1/2004 | Janakiraman | H01L 21/67017 118/715 |
| 2004/0053428 A1 | 3/2004 | Steger | |
| 2004/0060595 A1* | 4/2004 | Chittenden | G05D 11/133 137/100 |
| 2004/0089240 A1 | 5/2004 | Dando et al. | |
| 2004/0094206 A1* | 5/2004 | Ishida | G05D 7/0658 137/487.5 |
| 2004/0112538 A1* | 6/2004 | Larson | H01L 21/67017 156/345.33 |
| 2004/0112539 A1* | 6/2004 | Larson | H01L 21/67017 156/345.33 |
| 2004/0112540 A1* | 6/2004 | Larson | G05D 7/0664 156/345.33 |
| 2004/0149389 A1 | 8/2004 | Fink | |
| 2004/0163601 A1 | 8/2004 | Kadotani et al. | |
| 2004/0168719 A1* | 9/2004 | Nambu | G05D 7/0664 137/87.04 |
| 2004/0173270 A1* | 9/2004 | Harris | F15B 13/081 137/884 |
| 2004/0200529 A1* | 10/2004 | Lull | G05D 7/0664 137/487.5 |
| 2004/0250600 A1* | 12/2004 | Bevers | G01F 25/0038 73/1.16 |
| 2004/0261492 A1* | 12/2004 | Zarkar | G01F 25/0053 73/1.34 |
| 2005/0005994 A1* | 1/2005 | Sugiyama | G05D 7/0664 141/4 |
| 2005/0067021 A1* | 3/2005 | Bevers | G01F 25/003 137/487.5 |
| 2005/0082007 A1 | 4/2005 | Nguyen et al. | |
| 2005/0155625 A1 | 7/2005 | Jangjian et al. | |
| 2005/0199342 A1* | 9/2005 | Shajii | C23C 16/45561 156/345.26 |
| 2005/0241763 A1* | 11/2005 | Huang | C23C 16/45561 156/345.33 |
| 2006/0011237 A1* | 1/2006 | Tison | G01F 25/0038 137/487.5 |
| 2006/0060141 A1 | 3/2006 | Kamaishi et al. | |
| 2006/0090797 A1* | 5/2006 | Olander | G05D 7/0652 137/487.5 |
| 2006/0097644 A1* | 5/2006 | Kono | G05D 16/206 315/111.21 |
| 2006/0124169 A1* | 6/2006 | Mizusawa | G05D 11/132 137/7 |
| 2006/0207595 A1* | 9/2006 | Ohmi | G05D 16/208 128/205.26 |
| 2006/0212233 A1* | 9/2006 | Wong | G01F 25/0038 702/50 |
| 2006/0237063 A1* | 10/2006 | Ding | G05D 11/132 137/487.5 |
| 2007/0026684 A1 | 2/2007 | Parascandola et al. | |
| 2007/0066038 A1* | 3/2007 | Sadjadi | H01J 37/32091 438/478 |
| 2007/0158025 A1* | 7/2007 | Larson | C23C 16/45561 156/345.26 |
| 2007/0175391 A1* | 8/2007 | Mizusawa | C23C 16/455 118/689 |
| 2007/0204797 A1 | 9/2007 | Fischer | |
| 2007/0204914 A1* | 9/2007 | Kurosawa | G05D 11/132 137/487.5 |
| 2007/0233412 A1* | 10/2007 | Gotoh | G01F 1/6847 702/100 |
| 2007/0240778 A1* | 10/2007 | L'Bassi | G05D 7/0664 137/883 |
| 2007/0256785 A1* | 11/2007 | Pamarthy | H01J 37/3244 156/345.33 |
| 2007/0256786 A1* | 11/2007 | Zhou | H01J 37/32477 156/345.34 |
| 2007/0259112 A1* | 11/2007 | Ishikawa | C23C 16/45561 427/248.1 |
| 2008/0115834 A1* | 5/2008 | Geoffrion | G05D 11/132 137/9 |
| 2008/0121177 A1* | 5/2008 | Bang | C23C 16/4405 118/723 I |
| 2008/0121178 A1* | 5/2008 | Bang | C23C 16/4405 |
| 2008/0202588 A1* | 8/2008 | Gold | C23C 16/4412 137/2 |
| 2008/0202609 A1* | 8/2008 | Gold | H01J 37/3244 137/597 |
| 2008/0202610 A1* | 8/2008 | Gold | H01J 37/3244 137/597 |
| 2008/0223873 A1 | 9/2008 | Chen et al. | |
| 2008/0236749 A1 | 10/2008 | Koshimizu et al. | |
| 2009/0056629 A1 | 3/2009 | Katz et al. | |
| 2009/0061083 A1* | 3/2009 | Chiang | C23C 16/45544 427/248.1 |
| 2009/0061640 A1* | 3/2009 | Wong | C23C 16/4412 438/734 |
| 2009/0061644 A1* | 3/2009 | Chiang | C23C 16/45544 438/763 |
| 2009/0067954 A1 | 3/2009 | Lanee et al. | |
| 2009/0090174 A1* | 4/2009 | Paul | B01D 61/56 73/61.56 |
| 2009/0095364 A1* | 4/2009 | Itoh | C23C 16/45523 137/861 |
| 2009/0151419 A1* | 6/2009 | Doniat | G01N 27/06 73/1.03 |
| 2009/0183548 A1* | 7/2009 | Monkowski | G01F 25/0038 73/1.35 |
| 2009/0183549 A1* | 7/2009 | Monkowski | G01F 25/0038 73/1.35 |
| 2009/0197423 A1 | 8/2009 | Koshimizu et al. | |
| 2009/0221117 A1 | 9/2009 | Tan et al. | |
| 2009/0236313 A1 | 9/2009 | Qiu et al. | |
| 2009/0272717 A1* | 11/2009 | Pamarthy | H01L 21/30655 216/37 |
| 2009/0320754 A1* | 12/2009 | Oya | C23C 16/455 118/715 |
| 2010/0012310 A1* | 1/2010 | Christensen | F28D 9/0093 165/260 |
| 2010/0025369 A1 | 2/2010 | Negishi et al. | |
| 2010/0030390 A1* | 2/2010 | Yamaguchi | G05D 7/0664 700/285 |
| 2010/0071438 A1* | 3/2010 | Davis | G01F 1/667 73/1.34 |
| 2010/0144539 A1* | 6/2010 | Bergh | B01J 19/0046 506/7 |
| 2010/0145633 A1* | 6/2010 | Yasuda | G05D 7/0635 702/45 |
| 2010/0178770 A1 | 7/2010 | Zin | |
| 2010/0229976 A1* | 9/2010 | Hirata | G05D 7/0664 137/561 A |
| 2010/0264117 A1* | 10/2010 | Ohmi | C23C 14/22 216/67 |
| 2010/0269924 A1* | 10/2010 | Yasuda | G05D 11/132 137/488 |
| 2011/0019332 A1 | 1/2011 | Chistyakov | |
| 2011/0031111 A1 | 2/2011 | Kobayashi | |
| 2011/0094596 A1* | 4/2011 | Sugiyama | G05D 7/0664 137/14 |
| 2011/0135821 A1* | 6/2011 | Ding | C23C 16/45557 427/248.1 |
| 2011/0253225 A1* | 10/2011 | Beeby | F25J 1/0244 137/9 |
| 2011/0265883 A1* | 11/2011 | Cruse | H01J 37/3244 137/8 |
| 2011/0265951 A1* | 11/2011 | Xu | C23C 16/46 156/345.26 |
| 2011/0287631 A1 | 11/2011 | Yamamoto | |
| 2011/0303696 A1* | 12/2011 | Kelekar | B01J 19/0046 222/59 |
| 2012/0031500 A1* | 2/2012 | Hirose | C23C 16/45561 137/14 |
| 2012/0034786 A1 | 2/2012 | Dhindsa et al. | |

(56) References Cited

U.S. PATENT DOCUMENTS

| | | | |
|---|---|---|---|
| 2012/0097266 A1* | 4/2012 | Cobb | F16K 51/02 137/343 |
| 2012/0149213 A1 | 6/2012 | Nittala et al. | |
| 2012/0152364 A1* | 6/2012 | Hashimoto | G01N 33/0006 137/1 |
| 2012/0156363 A1* | 6/2012 | Quinn | C23C 16/45561 427/10 |
| 2012/0174990 A1* | 7/2012 | Yasuda | G05D 11/132 137/101 |
| 2012/0190208 A1* | 7/2012 | Ozu | H01J 37/3244 438/710 |
| 2012/0238102 A1 | 9/2012 | Zhang et al. | |
| 2012/0238103 A1 | 9/2012 | Zhang et al. | |
| 2012/0244715 A1 | 9/2012 | Lebouitz et al. | |
| 2012/0247386 A1* | 10/2012 | Sanchez | C30B 25/14 117/102 |
| 2012/0289057 A1* | 11/2012 | DeDontney | C23C 16/45519 438/758 |
| 2012/0298221 A1* | 11/2012 | Takeuchi | G05D 7/0652 137/497 |
| 2012/0305184 A1 | 12/2012 | Singh et al. | |
| 2012/0328780 A1* | 12/2012 | Yamagishi | G05D 7/0641 427/255.28 |
| 2013/0000731 A1* | 1/2013 | Singh | H01L 21/6719 137/1 |
| 2013/0008607 A1* | 1/2013 | Matsumoto | H01J 37/32238 156/345.41 |
| 2013/0025715 A1* | 1/2013 | Yamaguchi | F17D 1/00 137/561 R |
| 2013/0029494 A1 | 1/2013 | Sasaki et al. | |
| 2013/0029496 A1* | 1/2013 | Bauer | C23C 16/52 438/758 |
| 2013/0045605 A1 | 2/2013 | Wang et al. | |
| 2013/0085618 A1* | 4/2013 | Ding | C23C 16/45561 700/282 |
| 2013/0104996 A1* | 5/2013 | Oh | F16K 11/00 137/2 |
| 2013/0106286 A1 | 5/2013 | Banna et al. | |
| 2013/0131300 A1* | 5/2013 | Olmscheid | G05D 7/0664 137/87.04 |
| 2013/0145816 A1* | 6/2013 | Lowe | G05D 11/132 137/487.5 |
| 2013/0157388 A1 | 6/2013 | Grimbergen | |
| 2013/0220433 A1* | 8/2013 | Sawada | G05D 7/0664 137/883 |
| 2013/0255784 A1* | 10/2013 | Ye | H01L 21/02 137/1 |
| 2013/0270997 A1 | 10/2013 | Zhao et al. | |
| 2013/0288477 A1 | 10/2013 | Rieschl et al. | |
| 2014/0020764 A1* | 1/2014 | Woelk | C23C 16/45512 137/1 |
| 2014/0033828 A1* | 2/2014 | Larson | G01F 1/36 73/861.61 |
| 2014/0080308 A1 | 3/2014 | Chen et al. | |
| 2014/0120737 A1 | 5/2014 | Swaminathan et al. | |
| 2014/0141621 A1 | 5/2014 | Ren et al. | |
| 2014/0144471 A1* | 5/2014 | Kahlon | B08B 9/0321 134/22.12 |
| 2014/0182689 A1* | 7/2014 | Shareef | C23C 16/4412 438/734 |
| 2014/0213055 A1 | 7/2014 | Himori et al. | |
| 2014/0248780 A1 | 9/2014 | Ingle et al. | |
| 2014/0262038 A1 | 9/2014 | Wang et al. | |
| 2014/0273460 A1 | 9/2014 | Reyland et al. | |
| 2015/0010381 A1 | 1/2015 | Cai | |
| 2015/0017810 A1 | 1/2015 | Guha | |
| 2015/0059859 A1* | 3/2015 | Takahashi | H01J 37/32238 156/345.41 |
| 2015/0099066 A1* | 4/2015 | Huotari | C23C 16/45561 427/255.28 |
| 2015/0181684 A1 | 6/2015 | Banna et al. | |
| 2015/0184287 A1* | 7/2015 | Tsung | C23C 16/52 137/269 |
| 2015/0234390 A1* | 8/2015 | Koyomogi | G05D 7/0652 137/597 |
| 2015/0287572 A1* | 10/2015 | Daugherty | H01J 37/3244 438/710 |
| 2015/0340209 A1 | 11/2015 | Koltonski | |
| 2015/0371831 A1* | 12/2015 | Rozenzon | C23C 16/45578 239/548 |
| 2016/0111258 A1* | 4/2016 | Taskar | C23C 16/455 118/689 |
| 2016/0181116 A1 | 6/2016 | Berry, III et al. | |
| 2016/0211165 A1 | 7/2016 | McChesney et al. | |
| 2016/0211166 A1 | 7/2016 | Yan et al. | |
| 2016/0215392 A1* | 7/2016 | Yudovsky | C23C 16/45551 |
| 2016/0247688 A1 | 8/2016 | Zhu et al. | |
| 2016/0293431 A1* | 10/2016 | Sriraman | H01L 21/3065 |
| 2017/0018407 A1 | 1/2017 | Kondo | |
| 2017/0069511 A1 | 3/2017 | Yang et al. | |
| 2017/0110335 A1 | 4/2017 | Yang et al. | |
| 2017/0200586 A1 | 7/2017 | Treadwell et al. | |
| 2017/0213758 A1 | 7/2017 | Rice et al. | |
| 2017/0236688 A1 | 8/2017 | Caron et al. | |
| 2017/0236694 A1 | 8/2017 | Eason et al. | |
| 2017/0236741 A1 | 8/2017 | Angelov et al. | |
| 2017/0236743 A1 | 8/2017 | Severson et al. | |
| 2017/0278679 A1 | 9/2017 | Angelov et al. | |
| 2017/0287682 A1 | 10/2017 | Musselman et al. | |
| 2017/0287753 A1 | 10/2017 | Musselman et al. | |
| 2018/0053629 A1 | 2/2018 | Zhang et al. | |
| 2019/0013232 A1 | 1/2019 | Yan et al. | |
| 2019/0279888 A1* | 9/2019 | Gopalakrishnan | G01F 1/8468 |
| 2020/0049547 A1* | 2/2020 | Spyropoulos | C23C 16/00 |

FOREIGN PATENT DOCUMENTS

| | | | | |
|---|---|---|---|---|
| CN | 103730318 | A | 4/2014 | |
| CN | 104299929 | A | 1/2015 | |
| CN | 104752141 | A | 7/2015 | |
| CN | 104851832 | A | 8/2015 | |
| CN | 105336561 | A | 2/2016 | |
| CN | 107093569 | A | 8/2017 | |
| EP | 0424299 | A2 | 4/1991 | |
| EP | 0424299 | A3 | 8/1991 | |
| EP | 0838842 | A2 | 4/1998 | |
| JP | 2001-230239 | A | 8/2001 | |
| JP | 2015201552 | A | 11/2015 | |
| KR | 20040050080 | A | 6/2004 | |
| KR | 20050008792 | A | 1/2005 | |
| KR | 20080023569 | A | 3/2008 | |
| KR | 20130137962 | A | 12/2013 | |
| KR | 20140001540 | A | 1/2014 | |
| KR | 101974420 | B1 | 5/2019 | |
| KR | 101974422 | B1 | 5/2019 | |
| TW | 50623 | B | 10/2002 | |
| TW | 201207933 | A | 2/2012 | |
| TW | 201324653 | A | 6/2013 | |
| TW | 201436089 | | 9/2014 | |
| WO | WO-0040776 | A1 | 7/2000 | |
| WO | WO-2007008509 | A2 * | 1/2007 | G01F 1/36 |
| WO | WO-2011051251 | A1 | 5/2011 | |
| WO | WO-2013123617 | A1 * | 8/2013 | G01N 30/32 |
| WO | WO-2014068886 | A1 * | 5/2014 | G05D 7/0652 |
| WO | WO-2014163742 | A1 * | 10/2014 | H01J 37/3244 |

OTHER PUBLICATIONS

US PPA No. 62065497, entitled "Gas Supply Delivery Arrangement Including a Gas Splitter for Tunable Gas Flow Control," filed Oct. 17, 2014, in the names of Mark Taskar et al. (Year: 2014).*

D. A. Jobson. "On the Flow of a Compressible Fluid through Orifices." Proceedings of the Institution of Mechanical Engineers. 169[1](1955). pp. 767-776. https://doi.org/10.1243/PIME_PROC_1955_169_077_02 (Year: 1955).*

Cashco, Inc. "Fluid Flow Basics of Throttling Valves." 1999. pp. 1-56. Available Mar. 24, 2020 online at: https://www.controlglobal.com/assets/Media/MediaManager/RefBook_Cashco_Fluid.pdf. (Year: 1999).*

(56) References Cited

OTHER PUBLICATIONS

O'Keefe Controls Co. "Choked Flow of Gases." in Catalog 11. 2003. pp. 20-24 & 48. (Year: 2003).*
Christophe Corre. "Lecture 5: Quasi-1 D compressible Flows" in "Fundamentals of Compressible and Viscous Flow Analysis—Part II." 2018. pp. 94-148. École Centrale de Lyon. Fluid Mechanics and Acoustics Laboratory (LMFA ). http://lmfa.ec-lyon. (Year: 2018).*
U.S. Appl. No. 15/399,692, Treadwell et al.
Blain (Mar./ Apr. 1999) "Mechanism of nitrogen removal from silicon nitride by nitric oxide," Journal of Vacuum Science & Technology A, 17(2):665-667.
Blain et al. (Jul./Aug. 1996) "Role of nitrogen in the downstream etching of silicon nitride," Journal of Vacuum Science & Technology A, 14(4):2151-2157.
Bohr, Mark, "The New Era of Scaling in an SoC World" Intel Logic Technology Development; ISSCC; 2009; 66 Pages.
Dusa, Mircean et al., "Pitch Doubling Through Dual Patterning Lithography Challenges in Integration and Litho Budgets," Optical Microlithography XX, vol. 6520, 65200G, (2007); 10 pages.
European Extended Search Report dated May 30, 2016 issued in EP 15 199 363.1.
Kastenmeier et al. (Nov./Dec. 1999) "Highly selective etching of silicon nitride over silicon and silicon dioxide," J. Vac. Sci. Techno!, A, American Vacuum Society, I7 (6):3179-3184.
Kastenmeier et al. (Sep./Oct. 1996) "Chemical dry etching of silicon nitride and silicon dioxide using CF4/O2/N2 gas mixtures," J. Vac. Sci. Technol. A14(5):2802-2813.
Oehrlein et al. (1996) "Study of plasma-surface interactions: chemical dry etching and high-density plasma etching," Plasma Sources Sci. Technol. 5:193-199.
Tajima et al. (2013) "Room-Temperature Si Etching in NO/F2 Gases and the Investigation of Surface Reaction Mechanisms," The Journal of Physical Chemistry C, 117:5118-5125.
U.S. Office Action dated Oct. 5, 2015 issued in U.S. Appl. No. 14/576,020.
U.S. Final Ofice Action dated Feb. 26, 2016 issued in U.S. Appl. No. 14/576,020.
U.S. Office Action dated Sep. 23, 2016 issued in U.S. Appl. No. 14/576,020.
Yun et al. (2007) "Large Etch Rate Enhancement by NO-Induced Surface Chemical Reaction during Chemical Dry Etching of Silicon Oxide in F2 Remote Plasmas," Journal of The Electrochemical Society, 154(4):D267-D272.
U.S. Appl. No. 15/013,400, filed Feb. 2, 2016, Yang et al.
U.S. Appl. No. 15/014,539, filed Feb. 3, 2016, Yang et al.
U.S. Appl. No. 62/275,537, filed Jan. 7, 2016, Treadwell et al.
MP125E N-470 Linear Drive User Manual; Version 1.1.0; Date Sep. 18, 2014; 54 Pages; Physik Instrumente (PI) GmbH & Co. KG, Auf der Roemerstr. 1, 76228 Karlsruhe, Germany.
First Office Action dated Dec. 29, 2017 corresponding to Chinese Patent Application No. 201610032252.1, 12 Pages.
First Office Action dated Aug. 2, 2018 corresponding to Chinese Patent Application No. 201710036188.9, 7 pages.

* cited by examiner

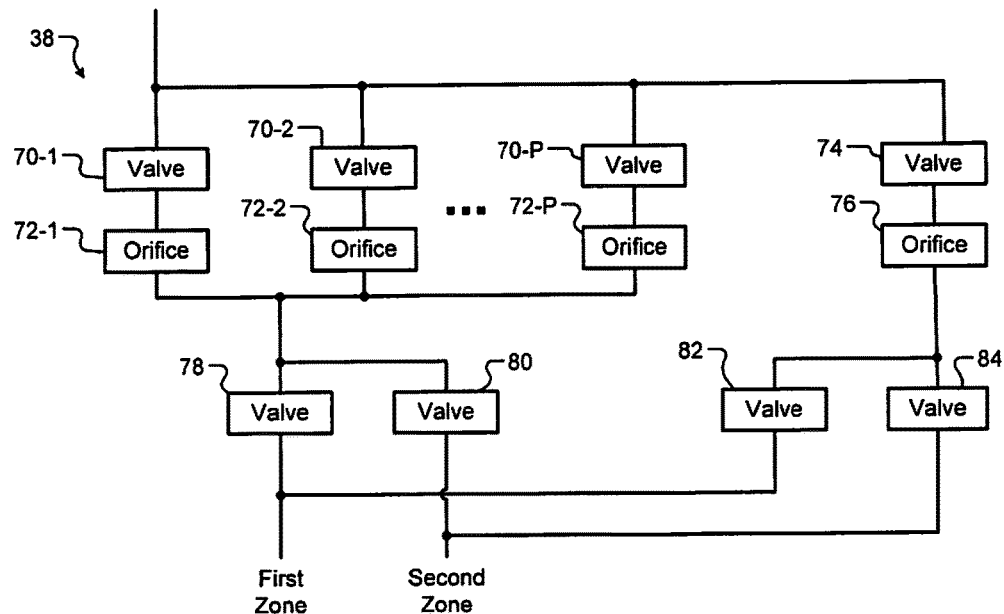
FIG. 6
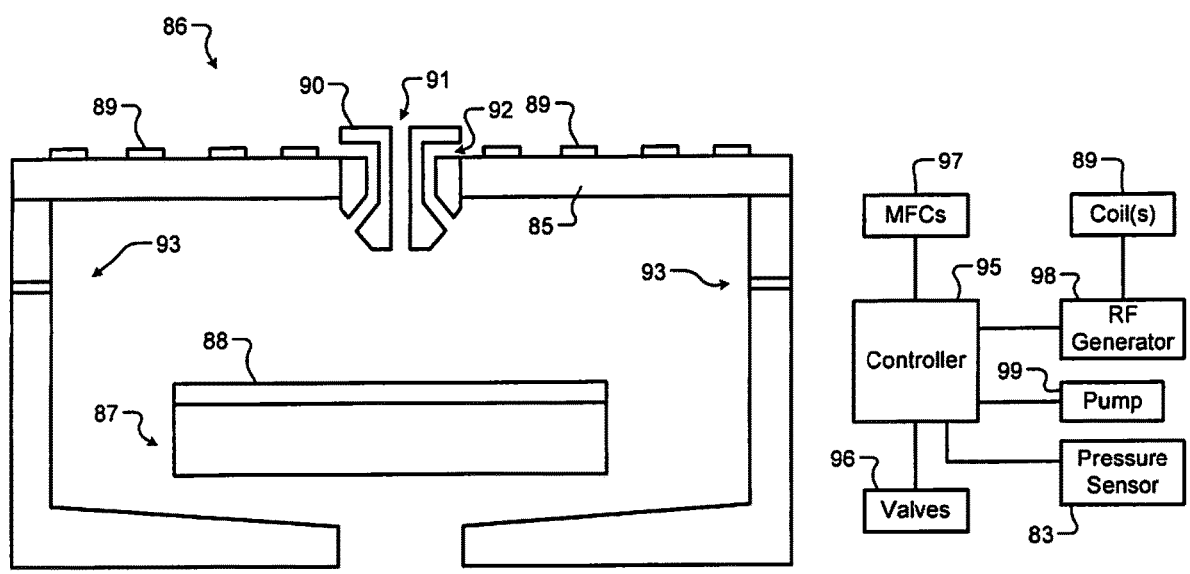
FIG. 7
FIG. 8

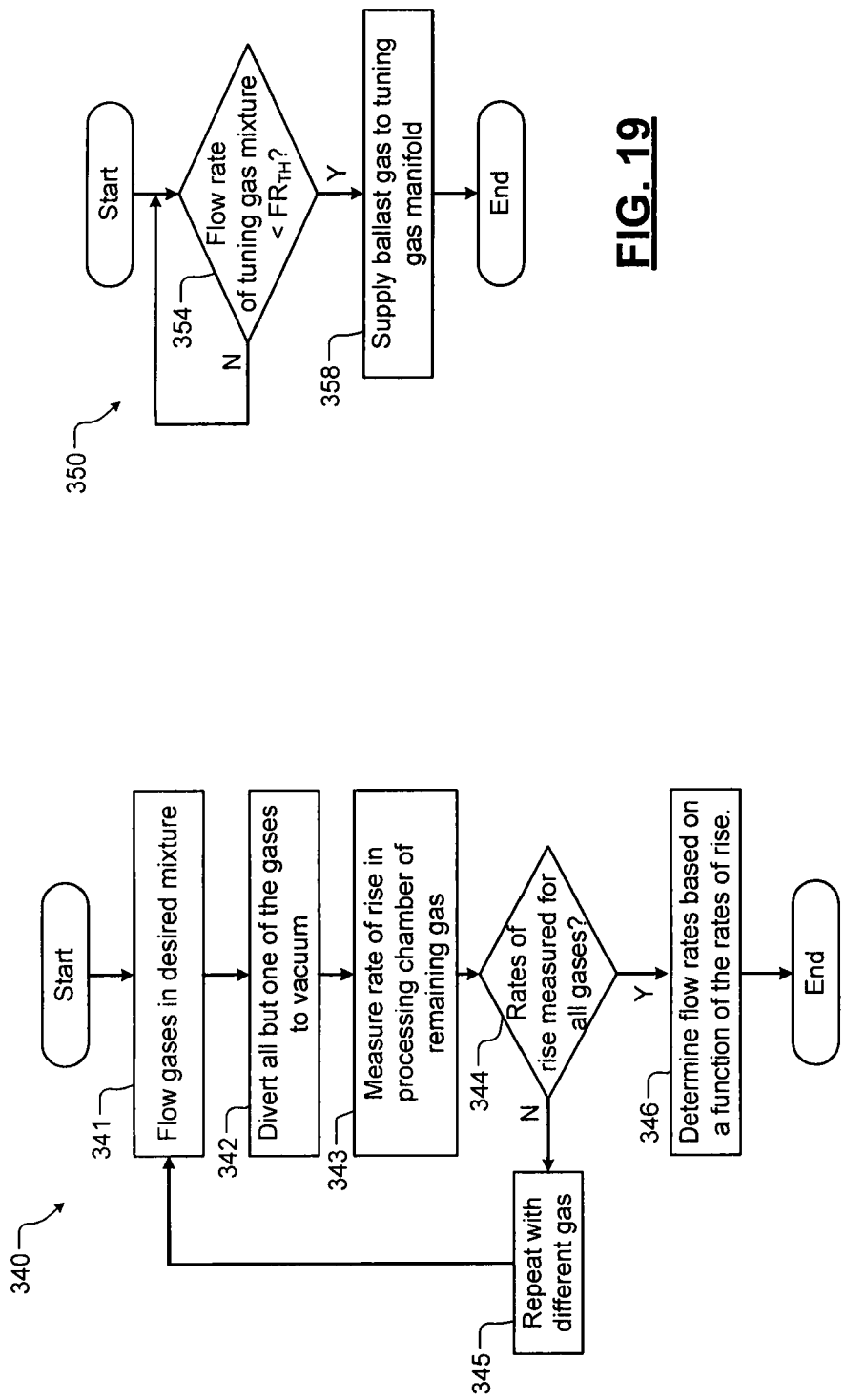

GAS DELIVERY SYSTEM

CROSS-REFERENCE TO RELATED APPLICATIONS

This application claims the benefit of U.S. Provisional Application No. 62/199,031, filed on Jul. 30, 2015, which is incorporated herein by reference in its entirety.

FIELD

The present disclosure relates to gas delivery systems, and more particularly to gas delivery systems for substrate processing systems.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems include a processing chamber and a pedestal. A substrate such as a semiconductor wafer is arranged on the pedestal during processing. The substrate processing systems may be used to deposit, etch or otherwise treat film on the substrate.

Gas delivery systems are used to deliver gas mixtures into the processing chamber. The gas mixtures include one or more process gases and/or precursor gases. Different gas mixtures are supplied to the processing chamber during various steps of a process or recipe. Supplying the different gas mixtures quickly and accurately without intervening downtime reduces overall processing time.

Current gas delivery systems include a gas delivery sub-system with gas sources connected by mass flow controllers (MFCs) to a manifold. An outlet of the manifold is connected to the processing chamber where substrate processing takes place. A separate gas supply may supply a gas or a mixture of gases to a second zone of the processing chamber.

Referring now to FIG. 1, a gas delivery system 10 includes N gas sources that are connected to a gas delivery sub-system 11 including gas valves and mass flow controllers (MFCs), where N is an integer greater than one. The valves and MFCs are used to supply gas mixtures from one or more of the N process gas sources. Outputs of the gas delivery sub-system 11 are input to a mixing manifold 12 where the gases are mixed and output to one or more of a plurality of gas outlets. A valved manifold 13 receives gas from the one or more of the plurality of gas outlets of the mixing manifold 12 and outputs the gas mixture to a first zone of the processing chamber. A tuning gas source 14 supplies a tuning gas mixture via a valve 15 (and optionally a MFC) to a second zone.

In order to allow the mixture of gases to the second zone of the processing chamber to be changed, additional gas sources and MFCs may be provided along with a second manifold. Alternately, a gas connection to a MFC is changed, which requires reconfiguration and usually cannot be carried out between process steps or recipes. In another approach, flow from a controller that was supplying the processing chamber is supplied instead to the second zone using a second manifold with valves that switch gas flow between the first manifold and the second manifold.

SUMMARY

A gas delivery system for a substrate processing system includes a first manifold and a second manifold. A gas delivery sub-system selectively delivers N gases from N gas sources. The gas delivery sub-system is configured to deliver a first gas mixture including P of the N gases to the first manifold and to deliver a second gas mixture including Q of the N gases to the second manifold, where N, P and Q are integers. P plus Q is less than or equal to N, and N is greater than two. A gas splitter includes an inlet in fluid communication with an outlet of the second manifold, a first outlet in fluid communication with an outlet of the first manifold, and a second outlet. The gas splitter splits the second gas mixture into a first portion at a first flow rate that is output to the first outlet of the gas splitter and a second portion at a second flow rate that is output to the second outlet of the gas splitter. A first zone of the substrate processing system is in fluid communication with the first outlet of the gas splitter and a second zone of the substrate processing system is in fluid communication with the second outlet of the gas splitter.

In other features, the gas delivery sub-system includes N gas channels each including a first valve including an inlet in fluid communication with one of the N gas sources. A mass flow controller includes an inlet in fluid communication with an outlet of the first valve. A second valve includes an inlet in fluid communication with an outlet of the mass flow controller and an outlet in selective fluid communication with the first manifold. A third valve includes an outlet in fluid communication with the outlet of the mass flow controller and an outlet in selective fluid communication with the second manifold.

In other features, a first valve is in communication with a ballast gas source to selectively supply ballast gas to the second manifold. A second valve is in fluid communication with the ballast gas source to selectively supply ballast gas to the second outlet of the gas splitter. The first valve supplies the ballast gas to the second manifold when a flow rate of the second gas mixture is insufficient to create a choked flow condition through the gas splitter.

In other features, the gas splitter includes M valves and M restricted orifices in communication with a corresponding one of the M valves. At least two of the M restricted orifices have different orifice sizes.

A substrate processing system includes the gas delivery system and a processing chamber. A substrate support is arranged in the processing chamber. A first injector is arranged at a first location of the processing chamber. The first injector corresponds to the first zone. A second injector is arranged at a second location of the processing chamber spaced from the first location. The second injector corresponds to the second zone.

In other features, the processing chamber includes a dielectric window. The first injector is arranged in an opening of the dielectric window. The processing chamber includes side walls. The second injector is arranged on at least one of the side walls.

In other features, a first valve includes an inlet in fluid communication with the first outlet of the gas splitter and an outlet in fluid communication with vacuum. A second valve includes an inlet in fluid communication with the second outlet of the gas splitter and an outlet in fluid communication with vacuum.

In other features, a controller calculates relative flow rates of the first portion of the second gas mixture and the second portion of the second gas mixture.

In other features, a pressure sensor is arranged in the processing chamber and communicates with the controller. The controller calculates the relative flow rates of the first portion of the second gas mixture and the second portion of the second gas mixture by opening the first valve to vacuum and closing the second valve to vacuum; measuring a rate of rise in pressure of the first portion of one of a calibration gas and the second gas mixture in the processing chamber; opening the second valve to vacuum and closing the first valve to vacuum; and measuring a rate of rise in pressure of the second portion of the one of the calibration gas and the second gas mixture in the processing chamber.

In other features, the first manifold includes a first mixing manifold in fluid communication with the gas delivery sub-system and a first valved manifold in fluid communication with the first mixing manifold. The second manifold includes a second mixing manifold in fluid communication with the gas delivery sub-system and a second valved manifold in fluid communication with the second mixing manifold.

A gas delivery system for a substrate processing system includes a first manifold and a second manifold. A gas delivery sub-system selectively delivers N gases from N gas sources. The gas delivery sub-system is configured to deliver a first gas mixture including P of the N gases to the first manifold and to deliver a second gas mixture including Q the N gases to the second manifold, where N, P and Q are integers, P plus Q is less than or equal to N, and N is greater than two.

A first gas splitter includes an inlet in fluid communication with an outlet of the first manifold, a first outlet and a second outlet. The first gas splitter splits the first gas mixture into a first portion that is output to the first outlet of the first gas splitter, and a second portion that is output to the second outlet of the first gas splitter. A second gas splitter includes an inlet in fluid communication with an outlet of the second manifold, a first outlet, a second outlet, and a third outlet. The second gas splitter splits the second gas mixture into a first portion that is output to the first outlet of the second gas splitter, a second portion that is output to the second outlet of the second gas splitter, and a third portion that is output to the third outlet of the first gas splitter. A first zone of the substrate processing system is in fluid communication with the first outlet of the first gas splitter and the first outlet of the second gas splitter. A second zone of the substrate processing system is in fluid communication with the second outlet of the first gas splitter and the second outlet of the second gas splitter. A third zone of the substrate processing system is in fluid communication with the third outlet of the second gas splitter.

In other features, the gas delivery sub-system includes N gas channels each including a first valve and a mass flow controller including an inlet in fluid communication with an outlet of the first valve. A second valve includes an inlet in fluid communication with an outlet of the mass flow controller and an outlet in selective fluid communication with the first manifold. A third valve includes an inlet in fluid communication with the outlet of the mass flow controller and an outlet in selective fluid communication with the second manifold.

In other features, a first valve is in fluid communication with a ballast gas source to selectively supply ballast gas to the first manifold. A second valve is in fluid communication with the ballast gas source to selectively supply ballast gas to the second manifold. The second valve supplies the ballast gas to the second manifold when a flow rate of the second gas mixture is insufficient to create a choked flow condition through the second gas splitter.

In other features, the first gas splitter includes M valves and M restricted orifices in communication with a corresponding one of the M valves. At least two of the M restricted orifices have a different orifice size.

In other features, a first valve includes an inlet in fluid communication with the first outlet of the second gas splitter and an outlet in fluid communication with vacuum. A second valve includes an inlet in fluid communication with the second outlet of the second gas splitter and an outlet in fluid communication with vacuum. A third valve includes an inlet in fluid communication with the third outlet of the second gas splitter and an outlet in fluid communication with vacuum. A fourth valve includes an inlet in fluid communication with the third outlet of the second gas splitter and an outlet in fluid communication with the third zone.

In other features, a controller is configured to close the first valve, the second valve and the fourth valve and to divert the third tuning gas mixture to vacuum when flow rates of the first tuning gas mixture and the second tuning gas mixture are insufficient to create a choked flow condition through the second gas splitter.

A substrate processing system includes the gas delivery system, a processing chamber, a substrate support arranged in the processing chamber, and a first injector arranged at a first location of the processing chamber and including a center injector and a side injector. The center injector corresponds to the first zone and the side injector corresponds to the second zone. A second injector is arranged at a second location of the processing chamber spaced from the first location. The second injector corresponds to the third zone.

In other features, the processing chamber includes a dielectric window. The first injector is arranged in a cavity in the dielectric window. The processing chamber includes side walls. The second injector is arranged on at least one of the side walls.

In other features, a first valve includes an inlet in fluid communication with the first outlet of the second gas splitter and an outlet in fluid communication with vacuum. A second valve includes an inlet in fluid communication with the second outlet of the second gas splitter and an outlet in fluid communication with vacuum. A third valve includes an inlet in fluid communication with the third outlet of the second gas splitter and an outlet in fluid communication with vacuum.

In other features, a controller calculates relative flow rates of the first portion of the second gas mixture, the second portion of the second gas mixture and the third portion of the second gas mixture.

In other features, a pressure sensor is arranged in the processing chamber and communicates with the controller. The controller calculates the relative flow rates of the first portion of the second gas mixture, the second portion of the second gas mixture and the third portion of the second gas mixture by opening the second valve and the third valve to vacuum, closing the first valve to vacuum, measuring a first rate of rise in pressure of the first portion of one of a calibration gas and the second gas mixture in the processing chamber, opening the first valve and the third valve to vacuum, closing the second valve to vacuum; measuring a second rate of rise in pressure of the second portion of the one of the calibration gas and the second gas mixture in the processing chamber; opening the first valve and the second valve to vacuum; closing the third valve to vacuum; and measuring a third rate of rise in pressure of the third portion of the one of the calibration gas and the second gas mixture in the processing chamber.

In other features, the controller determines relative flow rates of the first portion of the second gas mixture, the second portion of the second gas mixture and the third portion of the second gas mixture based on the first rate of rise, the second rate of rise and the third rate of rise.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 6 is a functional block diagram of another example of a dual gas feed according to the present disclosure;

FIG. 7 is a functional block diagram of an example of a processing chamber according to the present disclosure;

FIG. 8 is a functional block diagram of an example of a control system according to the present disclosure;

FIGS. 16-18 illustrate examples of methods for calibrating flow rates; and

FIGS. 19-20 illustrate examples of methods for using ballast gas in low flow rate conditions.

In the drawings, reference numbers may be reused to identify similar and/or identical elements.

DETAILED DESCRIPTION

Gas delivery systems and methods according to the present disclosure allow different mixtures of main process gas and tuning gas to be provided to two or more zones in a processing chamber while allowing the use of single mass flow controllers to supply the same gas to more than one of the zones (without duplicating the gas source). This allows the gas mixtures to be provided to the zones with reduced cost and complexity.

Gases are supplied via mass flow controllers (MFCs) to one of two or more manifolds, sometimes referred to herein as a main process gas manifold and a tuning manifold. The destination manifold for each gas can be selected using valves. In some examples, flow from the main process gas manifold may optionally be split into two or more flows each with the same gas composition at different flow rates. In some examples, the flows are supplied to different zones of the processing chamber using multi-zone injectors, two or more injectors, a showerhead, side injectors, etc.

In some examples, the main process gas split is performed using a continuously controllable first gas flow splitter or selectable banks of flow restricting orifices. Flow from the tuning gas manifold is split using a second gas flow splitter that typically has one more outlet than the first gas flow splitter used for the main process gas flow. In some examples, flow from one branch of the second gas flow splitter is directed to a further region of the processing chamber, typically the outermost zone outboard of the periphery of the wafer (such as side tuning gas (STG)).

Flows from the second gas flow splitter may be recombined with the main gas flows downstream from the first gas flow splitter. A separate delivery of a ballast gas may be combined with the side tuning gas (STG) flow to increase the flow in the side tuning gas mixture to a predetermined minimum level. The result is that many desired mixtures of gases may be delivered to the zones of the processing chamber without increasing the count of costly MFCs. Furthermore any process gas that is supplied to the delivery system may be used as a side tuning gas while also being used at the same time in the main process gas flow (without providing hardware to deliver the same gas twice).

The systems and methods of the present disclosure recombine gas from the tuning gas manifold with flow from the main process gas manifold to minimize the number of gas control sticks while providing flexible choice of gas delivery to different zones of the processing chamber.

Figure 1:
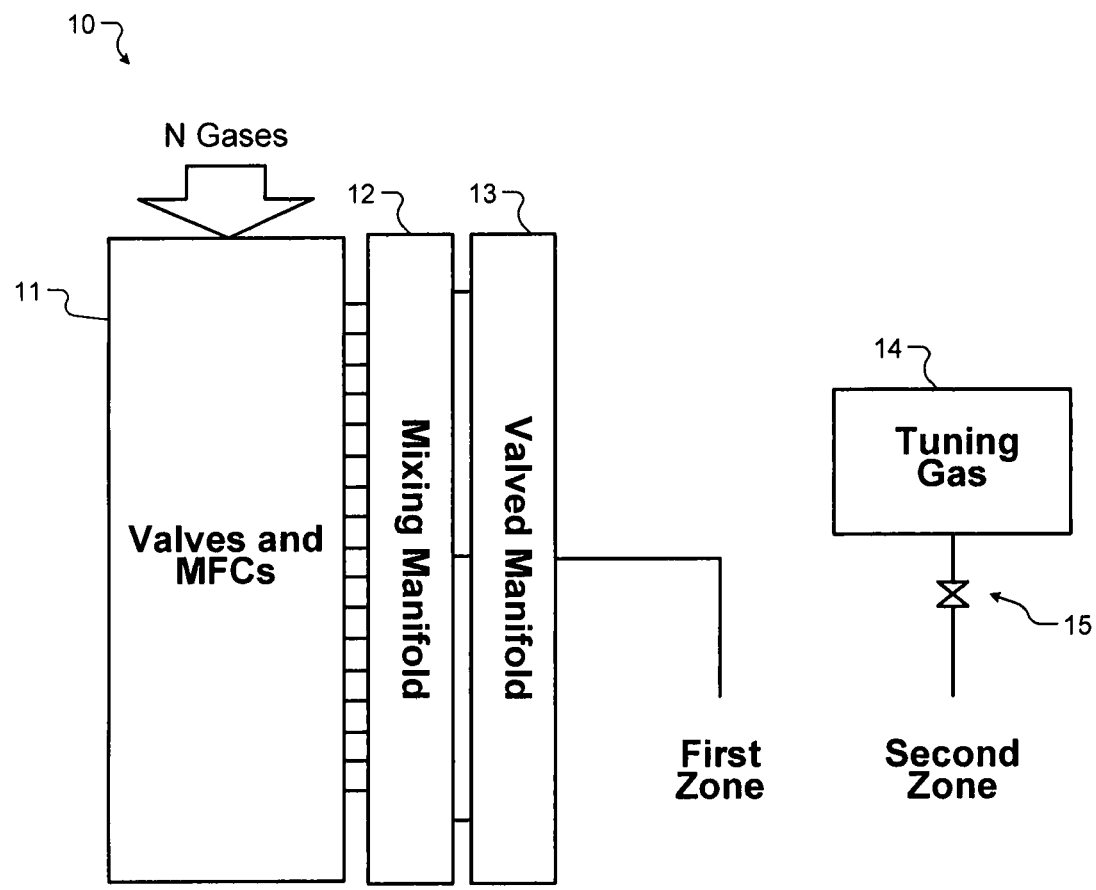
FIG. 1 is a functional block diagram of a gas delivery system according to the prior art.
Figure 2:
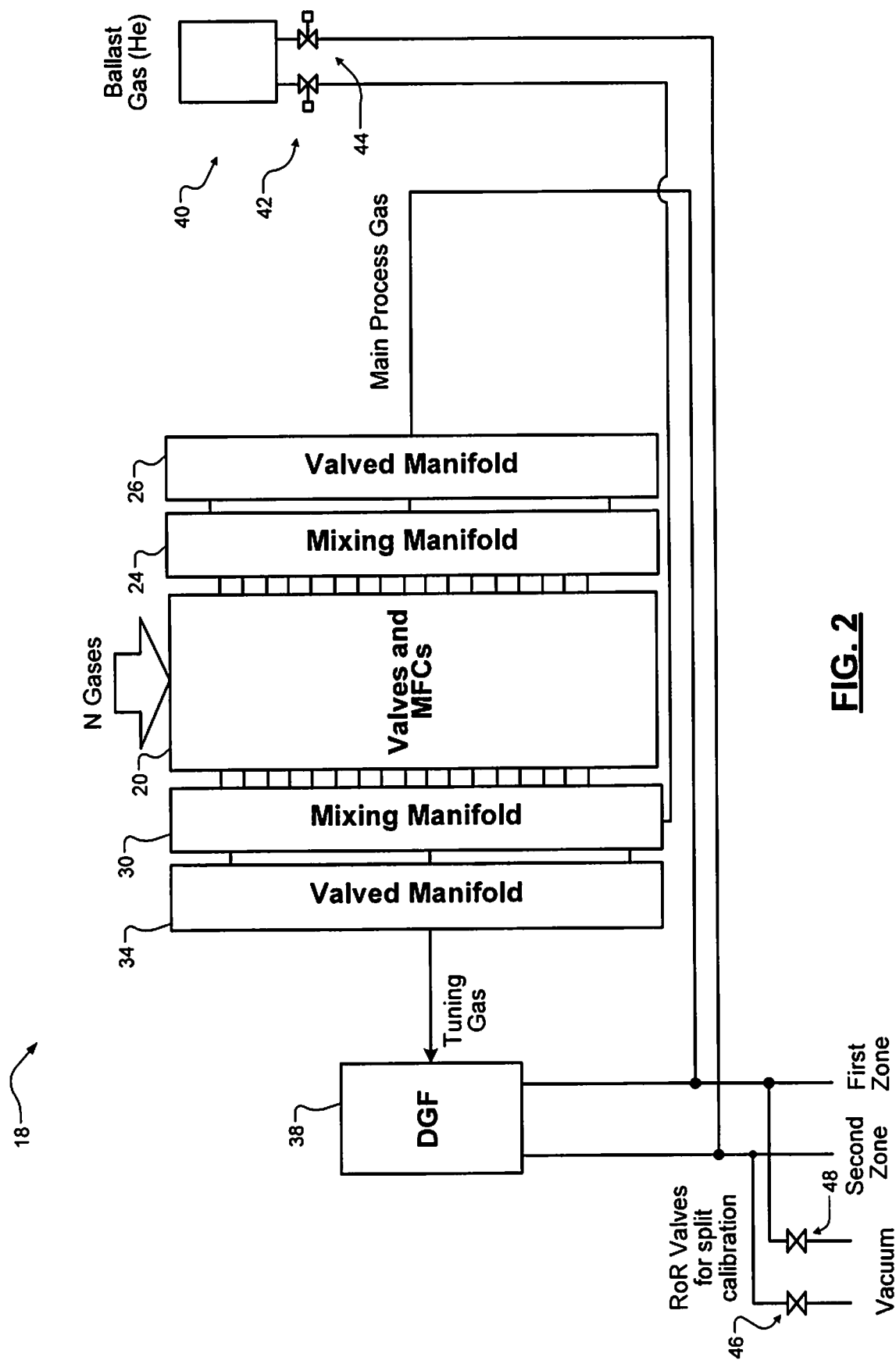
FIG. 2 is a functional block diagram of an example of a gas delivery system according to the present disclosure.

Referring now to FIG. 2, a gas delivery system 18 is shown. N gas sources are connected to a gas delivery sub-system 20 including valves and mass flow controllers (MFCs), where N is an integer greater than two. In some examples, N is equal to 17, although higher or lower values of N may be used. A first mixing manifold 24 is in fluid communication with outputs of the gas delivery sub-system 20. One or more outputs of the first mixing manifold 24 are in fluid communication with a first valved manifold 26, which outputs a main process gas mixture.

A second mixing manifold 30 is in fluid communication with outputs of the gas delivery sub-system 20. One or more outputs of the second mixing manifold 30 are in fluid communication with a second valved manifold 34. An output of the second valved manifold 34 (including a tuning gas mixture) is in fluid communication with a dual gas feed (DGF) 38. A first portion of the tuning gas mixture from the DGF 38 is combined with the main process gas output by the first valved manifold 26 and then output to a first zone of the processing chamber. In some examples, the first zone corresponds to an injector located on a top surface the processing chamber.

A second portion of the tuning gas mixture from the DGF 38 is selectively combined with ballast gas (from a ballast gas source 40 via valve 44) and output to a second zone of the processing chamber. In some examples, the second zone corresponds to side tuning gas (STG) locations located along side walls of the processing chamber. In some examples, the ballast gas includes helium (He), although one or more other inert gases or any other ballast gases may be used. The ballast gas may optionally be supplied to the second mixing manifold 30 during some operating modes as will be described below.

For example, when the tuning gas mixture is supplied at relatively low flow rates, there may be insufficient flow to create a choked flow condition at restricted orifices in the DGF 38. Choked flow conditions are typically present when there is over a 2 times pressure drop across the restricted orifice. When the choked flow condition is present, flow across the orifice is independent of the downstream pressure. Therefore, the ballast gas may be supplied to the second mixing manifold 30 when the tuning gas mixture has a lower flow rate than is necessary to create a choked flow condition. The ballast gas increases the flow rate to create the choked flow condition. For example, the choked flow condition may occur around 50 sccm. When the tuning gas flow is less than 50 sccm, the ballast gas can be supplied to the second mixing manifold 30 to increase the flow rate. For example if 10 sccm of tuning gas is supplied, 40 sccm of ballast gas can be supplied to the second mixing manifold 30 to create a choked flow condition with the tuning gas in the DGF 38.

Valves 46 and 48 selectively connect gas outputs to vacuum during flow rate calibration as will be described further below.

Figure 3A:
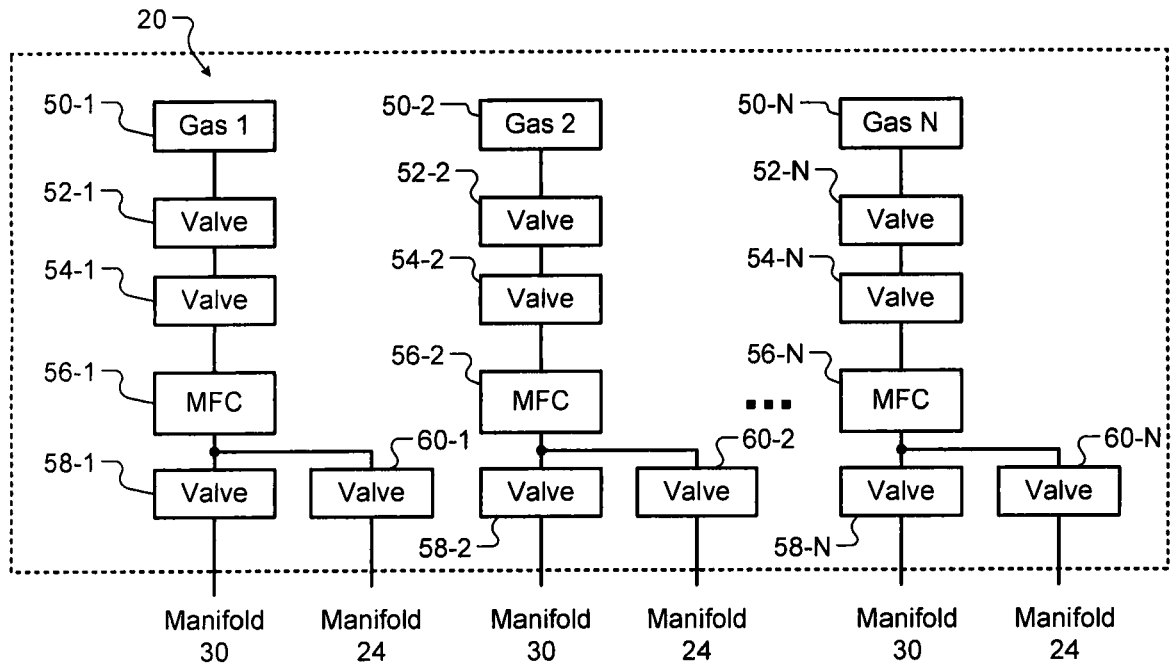
FIG. 3A is a functional block diagram of an example of a gas delivery sub-system including gas valves and mass flow controllers according to the present disclosure.

Referring now to FIG. 3A, the gas delivery sub-system 20 includes gas sources 50-1, 50-2, . . . , and 50-N (collectively gas sources 50). In some examples, the N gas sources gases include N different gases or gas mixtures. Outputs of the gas sources 50-1, 50-2, . . . , and 50-N are in fluid communication with inlets of first valves 52-1, 52-2, and . . . 52-N (collectively first valves 52), respectively. Outlets of the first valves 52-1, 52-2, . . . , and 52-N are in fluid communication with inlets of second valves 54-1, 54-2, . . . , and 54-N (collectively second valves 54), respectively. Outlets of the second valves 54-1, 54-2, and . . . 54-N are in fluid communication with MFCs 56-1, 56-2, . . . , and 56-N (collectively MFCs 56), respectively, which control flow rates of the gas sources 50. Outlets of the MFCs 56-1, 56-2, . . . , and 56-N are in fluid communication with inlets of valves 58-1, 58-2, . . . , and 58-N (collectively valves 58) and valves 60-1, 60-2, . . . , and 60-N (collectively valves 60), respectively. Outlets of the valves 58 are in fluid communication with the second mixing manifold 30 and outlets of the valves 60 are in fluid communication with the first mixing manifold 24. N is an integer greater than one.

Figure 3B:
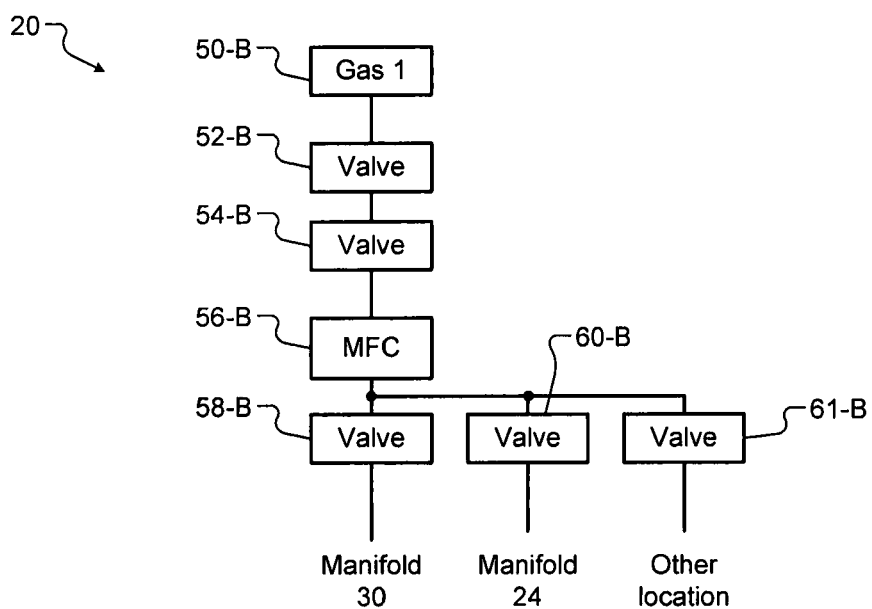
FIG. 3B is a functional block diagram of valves and a MFC to supply ballast gas.

Referring now to FIG. 3B, the gas delivery sub-system 20 may also be used to deliver ballast gas from gas source 50-B to the first and second manifolds and/or to other locations as will be described further below. The valves 52-B, 54-B, 58-B and 60-B and the MFC 56-B operate as described above. Valve 61-B is used to deliver ballast gas to other locations as will be described below.

Figure 4:
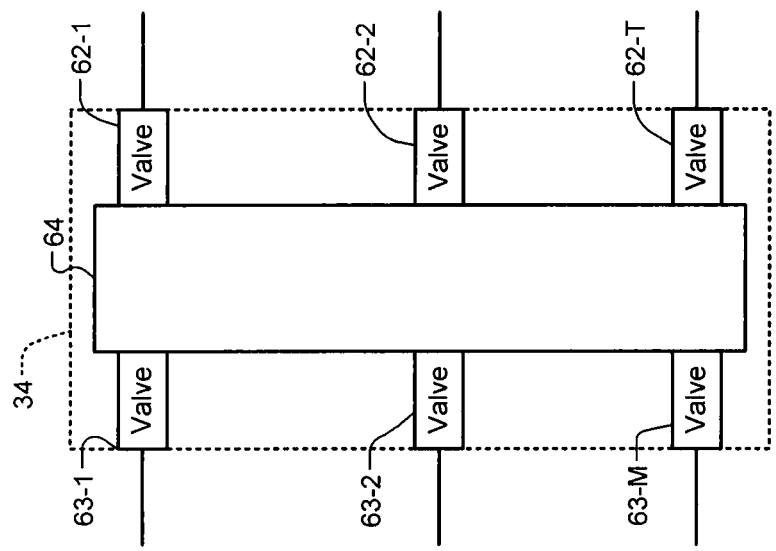
FIG. 4 is a functional block diagram of an example of a valved manifold according to the present disclosure.

Referring now to FIG. 4, the valved manifold 34 is shown in further detail and includes inlet valves 62-1, 62-2, . . . , and 62-T (collectively inlet valves 62) and outlet valves 63-1, 63-2, . . . , and 63-M (collectively outlet valves 63), and member 64. The inlet valves 62 may be used to directionally control flow of the gas mixture in the second mixing manifold 30 and the valved manifold 34. In some examples, T and M are integers greater than zero and T>=M. For example, in FIG. 4, T=3 and M=1. In other examples such as the gas delivery system in FIG. 9, the mixing manifold is omitted and T is equal to the number of gas sources (e.g. 17) and M is equal to 2 to 4, although other numbers of inlets and outlets may be used.

For example, in some circumstances the process gas mixture entering the second mixing manifold 30 may be received at one end of the second mixing manifold 30. Subsequently, other gases may be received in the middle of the second mixing manifold 30 or at an opposite end of the second mixing manifold 30. The valves 62 are switched and controlled to ensure that gas from a prior step in a recipe is properly evacuated from the second mixing manifold 30 and the valved manifold 34.

Figure 5:
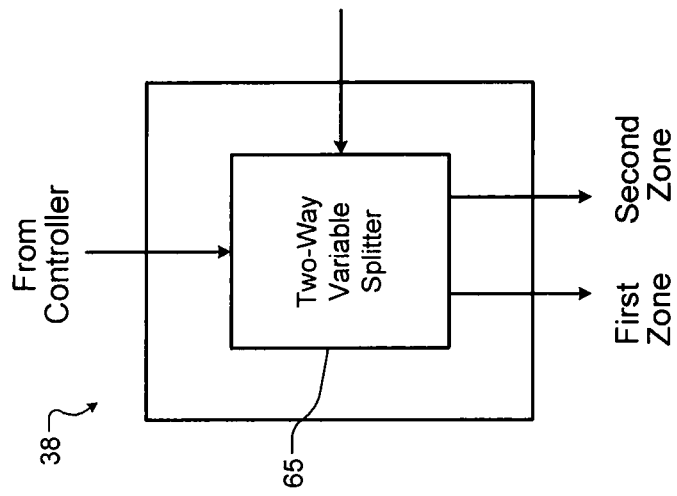
FIG. 5 is a functional block diagram of an example of a dual gas feed according to the present disclosure.

Referring now to FIG. 5, the DGF 38 may include a variable splitter 65 that splits the tuning gas mixture into first and second portions that are supplied to first and second zones of the processing chamber. The first and second portions of the tuning gas mixture may have the same or different flow rates. The variable splitter 65 may be controlled by a controller described below to adjust the flow rates of the first and second portions to the first zone, respectively, and/or the second zone of the processing chamber.

Referring now to FIG. 6, an example of the DGF 38 is shown. An inlet of the DGF 38 is in fluid communication with inlets of valves 70-1, 70-2, . . . , and 70-P (collectively valves 70). Outlets of the valves 70 are in fluid communication with restricted orifices 72-1, 72-2, . . . , and 72-P (collectively restricted orifices 72). In some examples, at least two of the restricted orifices 72 have different orifice sizes. In some examples, all of the restricted orifices 72 have different sizes. Outputs of the restricted orifices 72 are in fluid communication with inlets of valves 78 and 80. The inlet of the DGF 38 is also connected to an inlet of a valve 74. An outlet of the valve 74 is connected to an inlet of a restricted orifice 76. In some examples, all the restricted orifices 72 have different orifice sizes and the restricted orifice 76 has the same orifice size as one of the restricted orifices 72, although other combinations can be used. An outlet of the restricted orifice 76 is connected to inlets of valves 82 and 84. Outlets of the valves 78 and 82 supply the first zone of the processing chamber. Outlets of the valves 80 and 82 supply the second zone of the processing chamber.

As can be appreciated, states of the valves 82 and 84 can be selected to supply the first zone or the second zone using the restricted orifice 76. The other one of the first zone or the second zone is supplied through one of the plurality of restricted orifices 72. In some examples, the controller opens one or more of the valves 70 to allow process gas to flow through the corresponding restricted orifice(s). As can be appreciated, the relative gas flows of the first portion and the second portion of the tuning gas mixture to the first zone and the second zone, respectively, may be adjusted.

Referring now to FIG. 7, an example of a processing chamber 86 is shown. As can be appreciated, while a specific processing chamber is shown, other processing chambers may be used. The processing chamber 86 includes a substrate support 87 such as an electrostatic chuck, pedestal, plate or other substrate support. In some examples, the substrate support 87 is temperature controlled using resistive heaters, cooling channels and/or other suitable temperature control elements. A substrate 88 may be arranged on the substrate support 87 during substrate treatment. A top surface of the processing chamber 86 may include a dielectric window 85. An inductive coil 89 may be arranged on an atmospheric side or outer surface of the dielectric window 85.

An injector 90 may be arranged adjacent to or mounted on the dielectric window 85 to inject process gases into the processing chamber 86. In some examples, the injector 90 includes a center injection location 91 and one or more edge injector locations 92. The center injection location 91 injects process gas in a generally downward direction towards the substrate. The edge injector locations 92 inject process gas at an outward angle relative to the direction of the center injection location 91. The processing chamber further includes: one or more side tuning gas injection locations 93 arranged in sidewalls of the processing chamber 86; and an opening 94.

Referring now to FIG. 8, an example of a control system for the processing chamber 86 is shown to include a controller 95 that communicates with valves 96 and MFCs 97 to control main process gas flow and tuning gas flow. The controller 95 further communicates with an RF generator 98, which selectively supplies RF power to the inductive coils 89. The controller 95 also controls a pump 99 (and a corresponding one of the valves 96) to control pressure within the processing chamber and/or to selectively evacuate reactants from the processing chamber 86. The controller 95 also communicates with a pressure sensor 83 to measure pressure in the processing chamber. For example, the controller 95 may be used to calibrate the gas splitter using successive rate of rise calculations as will be described further below.

Figure 9:
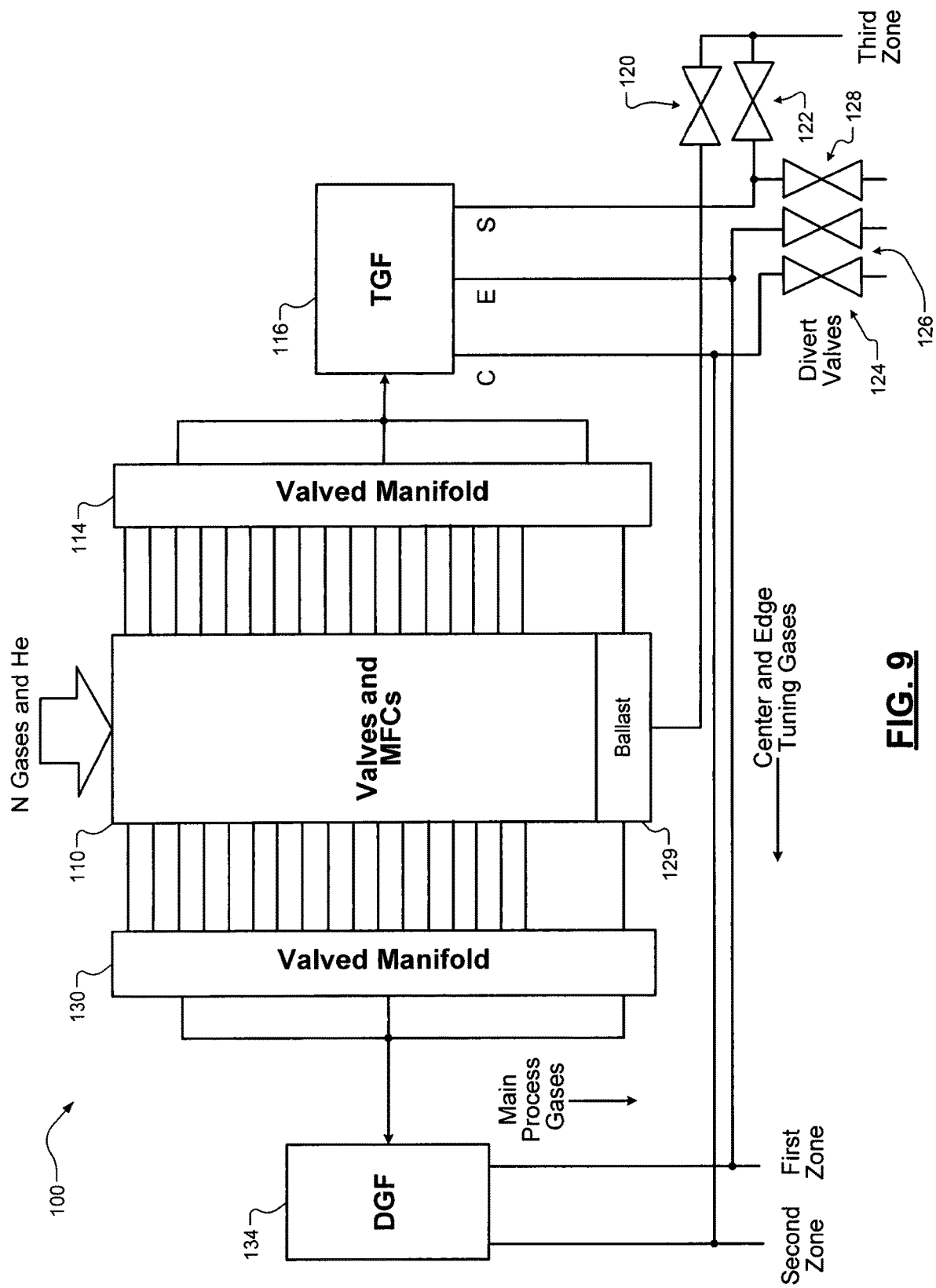
FIG. 9 is a functional block diagram of another example of a gas delivery system according to the present disclosure.

Referring now to FIG. 9, a gas delivery system 100 is configured for multiple gas (MG)/site tuning gas (STG) and reaction trajectory control (RTC) modes. While the gas delivery system in FIG. 2 delivered main process gas on the right side and tuning gas on the left side, the gas delivery system 100 in FIG. 9 delivers main process gas on the left side and tuning gas on the right side. In addition, while the gas delivery system in FIG. 2 delivers different gas flow rates and gas mixtures to first and second zones, the gas delivery system in FIG. 9 delivers different gas flow rates and gas mixtures to first, second and third zones as will be described further below.

N process gas sources and a ballast gas such as helium are connected to a gas delivery sub-system 110 including valves and MFCs, where N is an integer greater than two. In some examples, N is equal to 17, although other values may be used. A first valved manifold 114 is in fluid communication with outputs of the gas delivery sub-system 110. An output of the first valved manifold 114 is in fluid communication with triple gas feed (TGF) 116, which controls flow rates of tuning gases for first, second and third zones of the processing chamber. In some examples, the third zone may correspond to side tuning gas (STG) and the first and second zones may correspond to the injector center location and the injector edge locations, respectively.

A second valved manifold 130 is in fluid communication with outputs of the gas delivery sub-system 110. An output of the second valved manifold 130 is in fluid communication with a dual gas feed (DGF) 134. Outputs of the DGF 134 control flow rates of process gases at variable flow rates to first and second zones.

A ballast gas output 129 of the gas delivery sub-system 110 is connected to a valve 120. A first output of the TGF 116 is in fluid communication with inputs of valves 122 and 128. Outputs of the valves 120 and 122 are supplied as side tuning gas (STG). First gas outputs of the DGF 134 and the TGF 116 are input to a divert valve 124. Second gas outputs of the DGF 134 and the TGF 116 are input to a divert valve 126. A third gas output of the TFG 116 is input to a divert valve 128 and a valve 122.

The divert valves 124, 126 and 128 may be used for calibration. Likewise, the valves 46 and 48 in FIG. 2 may be used for calibration. In some examples, the calibration includes a rate of rise (RoR) calculation. For example, the tuning gas can be supplied with a desired split. Two of the three valves 124, 126 and 128 can be opened to divert part of the tuning gas split to vacuum. The remaining portion of the tuning gas mixture is delivered to the processing chamber. A first rate of rise ($RoR_1$) of gas pressure in the processing chamber is measured using the precursor sensor for a first one of the tuning gas zones. The process is repeated for the remaining tuning gas zones to determine second and third rates of rise ($RoR_2$ and $RoR_3$). Then, the relative flow rates are determined based on $RoR_1$, $RoR_2$ and $RoR_3$. In some examples, the flow rates are determined by dividing the individual rates of rise by the total of the rates of rise. A similar approach can be used for main process gas. One of the two valves 124 and 126 can be opened to divert part of the main process gas to vacuum.

Figure 10:
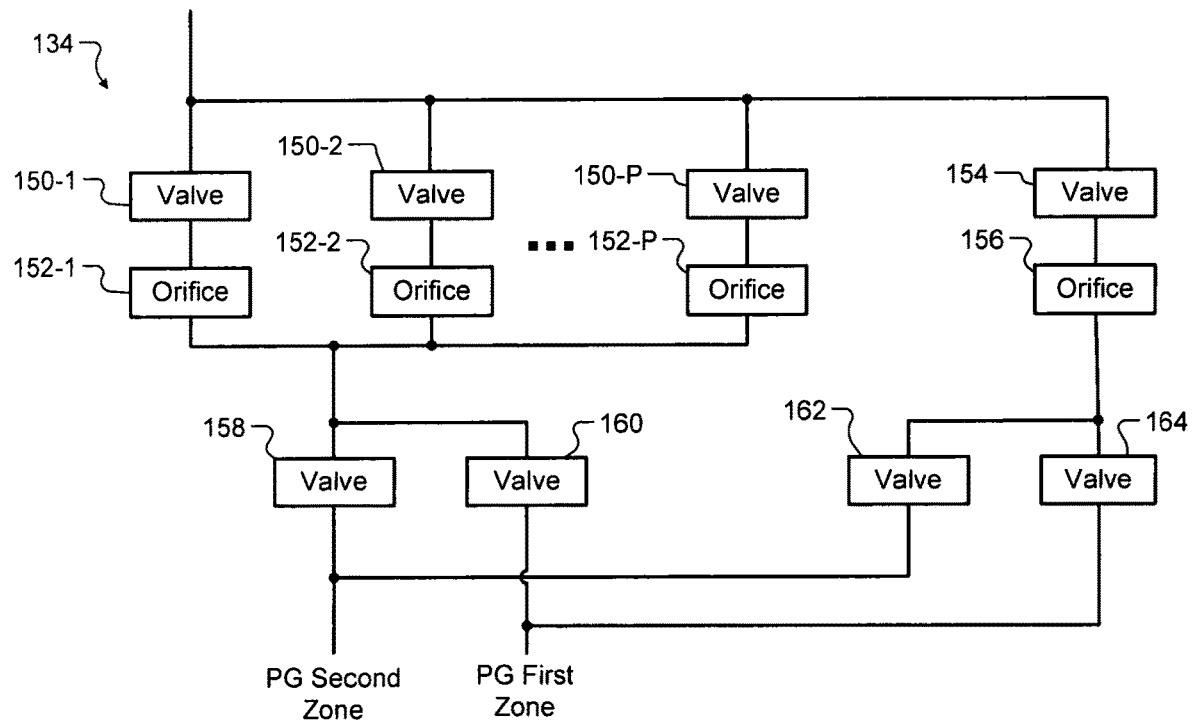
FIG. 10 is a functional block diagram of an example of a dual gas feed for the gas delivery system of FIG. 9.

In some examples, the DGF 134 includes a two-way variable splitter similar to that shown in FIGS. 5-6 above. However, the DGF 134 splits main process gas. Referring now to FIG. 10, another example of the DGF 134 is shown. An inlet of the DGF 134 is in fluid communication with inlets of valves 150-1, 150-2, . . . , and 150-P (collectively valves 150). Outlets of the valves 150 are in fluid communication with restricted orifices 152-1, 152-2, . . . , and 152-P (collectively restricted orifices 152), respectively. In some examples, at least two of the restricted orifices 152 have different orifice sizes. Outputs of the restricted orifices 152 are in fluid communication with inlets of valves 158 and 160. The inlet of the DGF 134 is also connected to an inlet of a valve 154. An outlet of the valve 154 is connected to an inlet of a restricted orifice 156. An outlet of the restricted orifice 156 is connected to inlets of valves 162 and 164. Outlets of the valves 158 and 162 supply main process gas to the second zone. Outlets of the valves 160 and 164 supply main process gas to the first zone.

As can be appreciated, the valves 162 and 164 can be positioned to supply one of the first zone or the second zone using the restricted orifice 156. The other one of the first zone or the second zone is supplied through one of the plurality of restricted orifices 152. In some examples, the controller opens one or more of the valves 150 to allow process gas to flow through the corresponding one or more of the restricted orifices. As can be appreciated, the relative gas flows to the first zone and the second zone may be adjusted.

Figure 11:
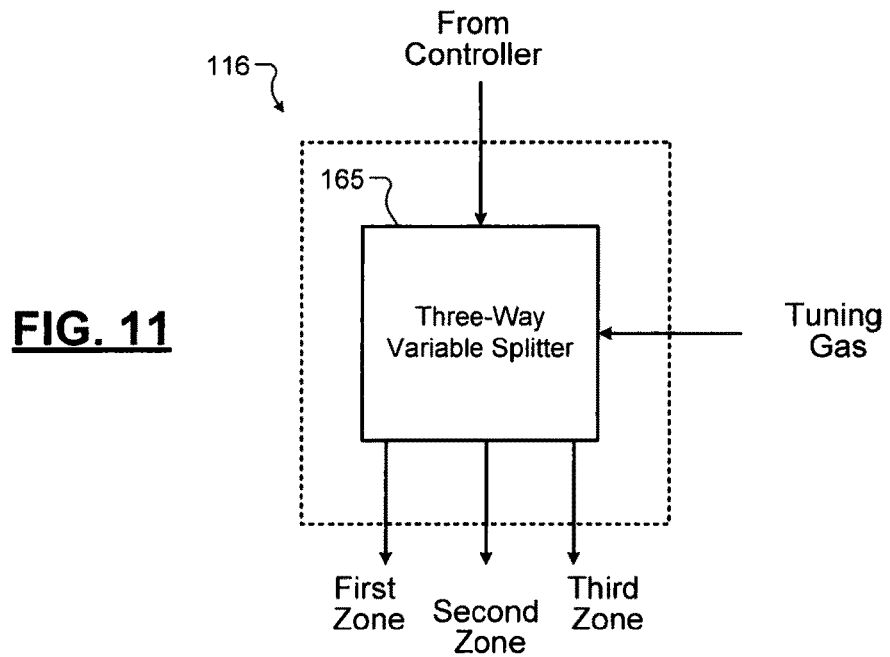
FIG. 11 is a functional block diagram of an example of a triple gas feed for the gas delivery system of FIG. 9.

Referring now to FIG. 11, the TGF 116 may include a three-way variable splitter 165 that splits an input tuning gas mixture into first, second and third tuning gas mixtures that are supplied to first, second and third zones of the processing chamber, respectively. The three-way variable splitter 165 may be controlled by a controller described below to adjust the flow of gases to the first zone, the second zone and the third zone of the processing chamber. For example only, the third zone may correspond to side tuning gas (STG) that is introduced from side walls of the processing chamber. The first and second zones may correspond to center and edge locations of the top injector.

Figure 12:
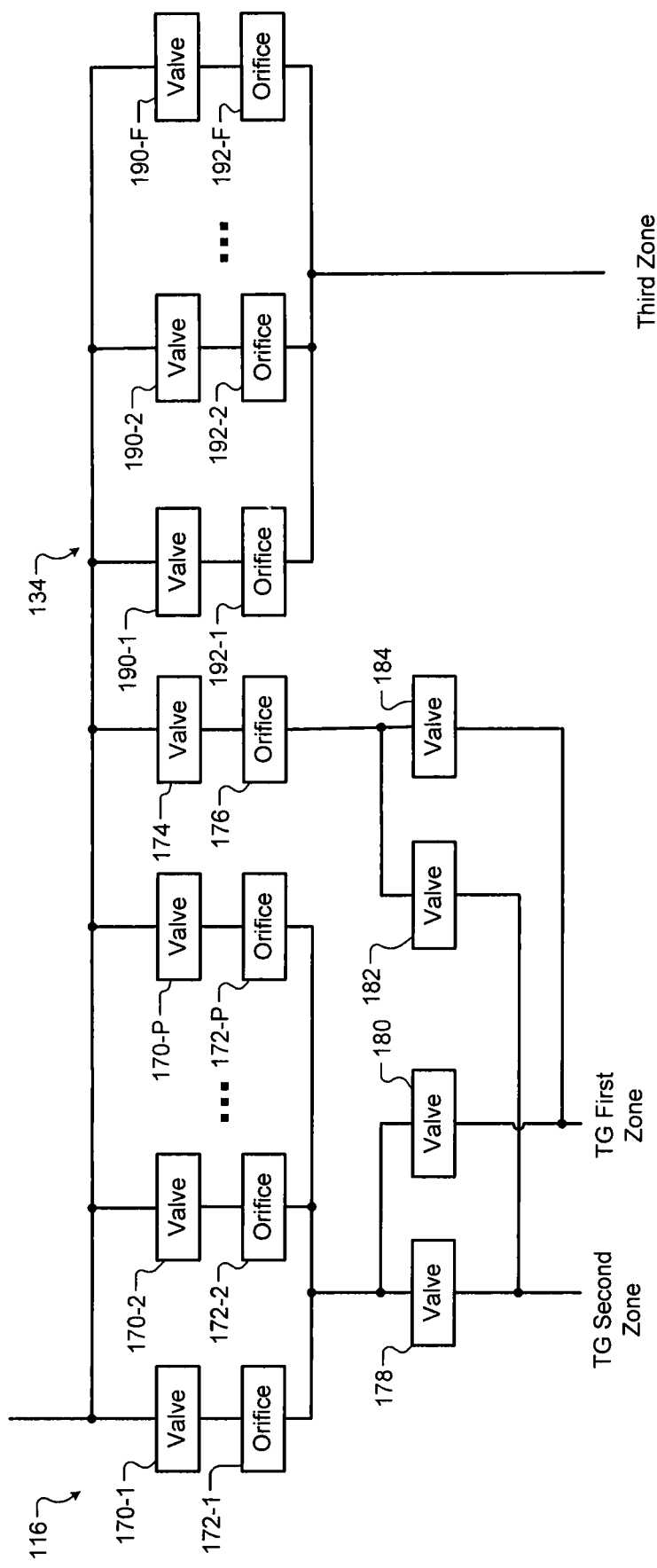
FIG. 12 is a functional block diagram of another example of a triple gas feed for the gas delivery system of FIG. 9.

Referring now to FIG. 12, an example of the TGF 116 is shown. An inlet of the TGF 116 is in fluid communication with inlets of valves 170-1, 170-2, . . . , and 170-P (collectively valves 170). Outlets of the valves 170 are in fluid communication with restricted orifices 172-1, 172-2, . . . , and 172-P (collectively restricted orifices 172), respectively. In some examples, at least two of the restricted orifices 172 have different orifice sizes. Outputs of the restricted orifices 172 are in fluid communication with inlets of valves 178 and 180. The inlet of the TGF 116 is in fluid communication with an inlet of a valve 174. An outlet of the valve 174 is in fluid communication with an inlet of a restricted orifice 176. An outlet of the restricted orifice 176 is in fluid communication with inlets of valves 182 and 184. Outlets of the valves 178 and 182 supply tuning gas to the second zone. Outlets of the valves 180 and 184 supply tuning gas the first zone.

As can be appreciated, the valves 182 and 184 can be positioned to supply tuning gas to either one of the first zone or the second zone using the restricted orifice 176. The other one of the first zone or the second zone is supplied through one of the plurality of restricted orifices 172. In some examples, the controller opens one or more of the valves 170 to allow process gas to flow through the corresponding one or more of the restricted orifices. As can be appreciated, the relative gas flows of tuning gas to the first zone and the second zone may be adjusted.

An inlet of the TGF 116 is in fluid communication with inlets of valves 190-1, 190-2, ..., and 190-F (collectively valves 190). Outlets of the valves 190 are in fluid communication with restricted orifices 192-1, 192-2, ..., and 192-F (collectively restricted orifices 192), respectively. F is an integer greater than one. In some examples, at least two of the restricted orifices 192 have different orifice sizes. Outputs of the restricted orifices 192 supply the side tuning gas location.

Figure 13:
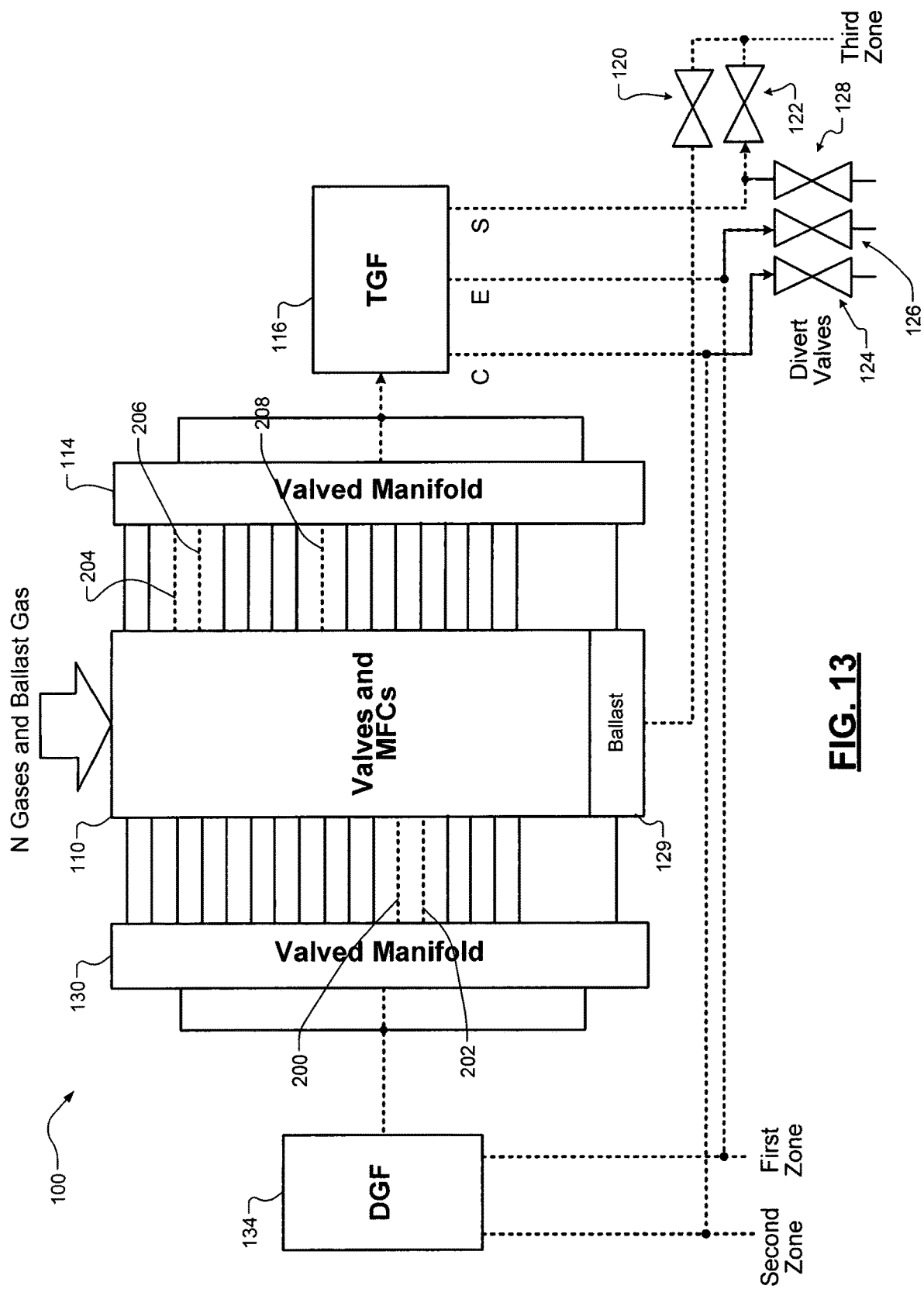
FIGS. 13-15 are functional block diagrams of examples of the gas delivery system of FIG. 9 in various example operating modes according to the present disclosure.

Referring now to FIG. 13, an example of typical operation of the gas delivery system is shown for relatively high tuning gas flow. The gas delivery sub-system 110 supplies a main process gas mixture including a first gas and a second gas as indicated at dotted lines 200 and 202. The first and second gases are supplied to the valved manifold 130. An output of the valved manifold 130 is in fluid communication with an input of the DGF 134. The DGF 134 splits the flow of the process gas mixture between the first zone and the second zone, which may in some examples correspond to the center and edge injector locations.

The gas delivery sub-system 110 also supplies first, second and third tuning gases 204, 206 and 208 to the valved manifold 114. The tuning gas mixture output by the valved manifold 114 is in fluid communication with an input of the TGF 116. The TGF 116 splits the tuning gas mixture into the first, second and third zones. The tuning gas for the first and second zones is in fluid communication with the corresponding outputs of the DGF 134. The tuning gas for the third zone is supplied via the valve 122 to the third zone. In some examples, the tuning gas flow is greater than or equal to 50 sccm for this configuration. The ballast gas may be introduced downstream of the TGF 116 to the side tuning gas location(s) using the valve 120.

Figure 14:
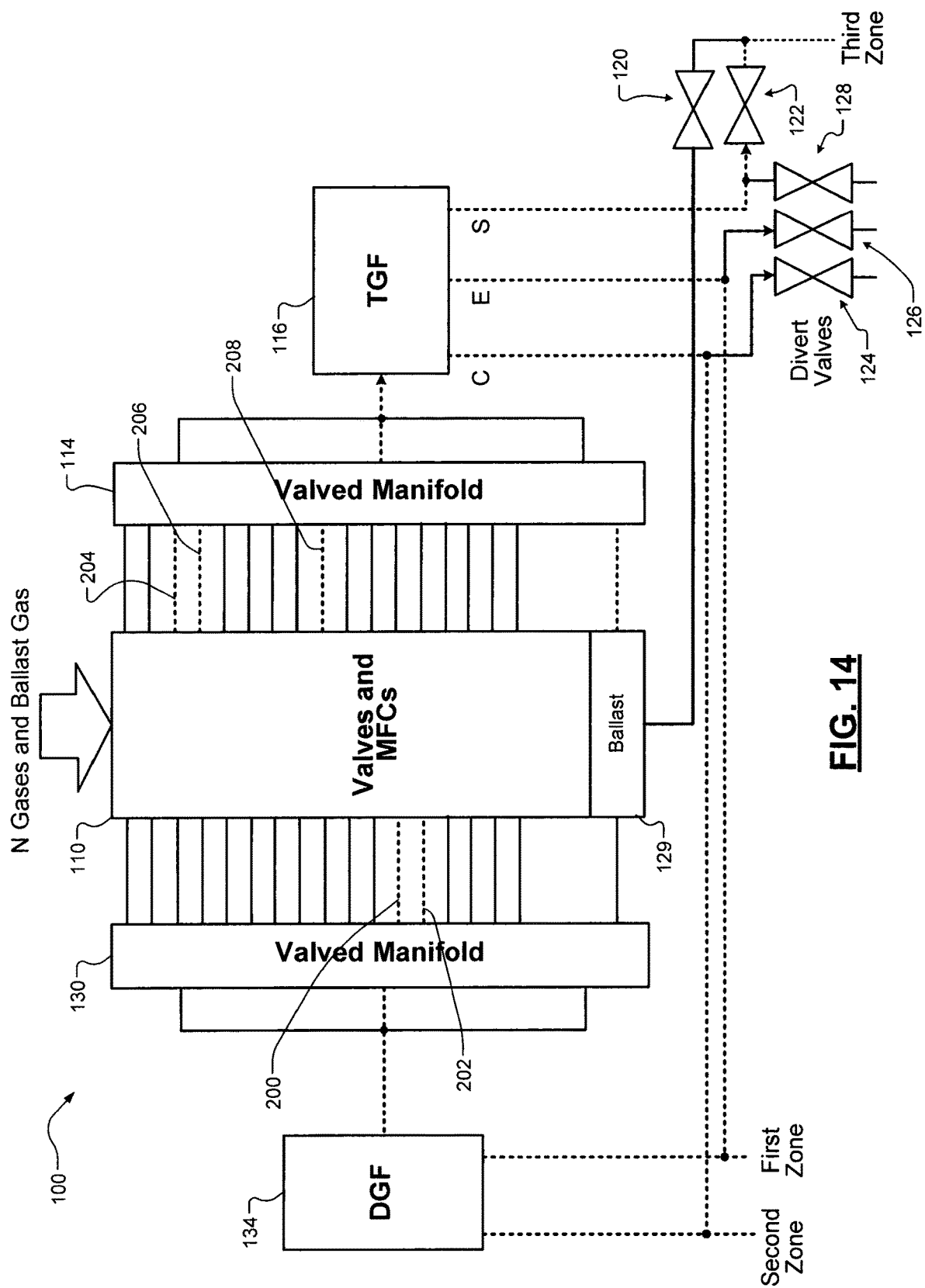

Referring now to FIG. 14, operation of the gas delivery system is shown for relatively low tuning gas flow. The main process gas mixture is selected and delivered as described above. However, the tuning gas flow rate may be insufficient to create a choked flow condition. For example, the tuning gas may not create a choked flow condition at flow rates less than 50 sccm in this configuration. In this case, ballast gas may be used as a push gas into the valved manifold 114, which reduces co-flow and choked flow effects.

Figure 15:
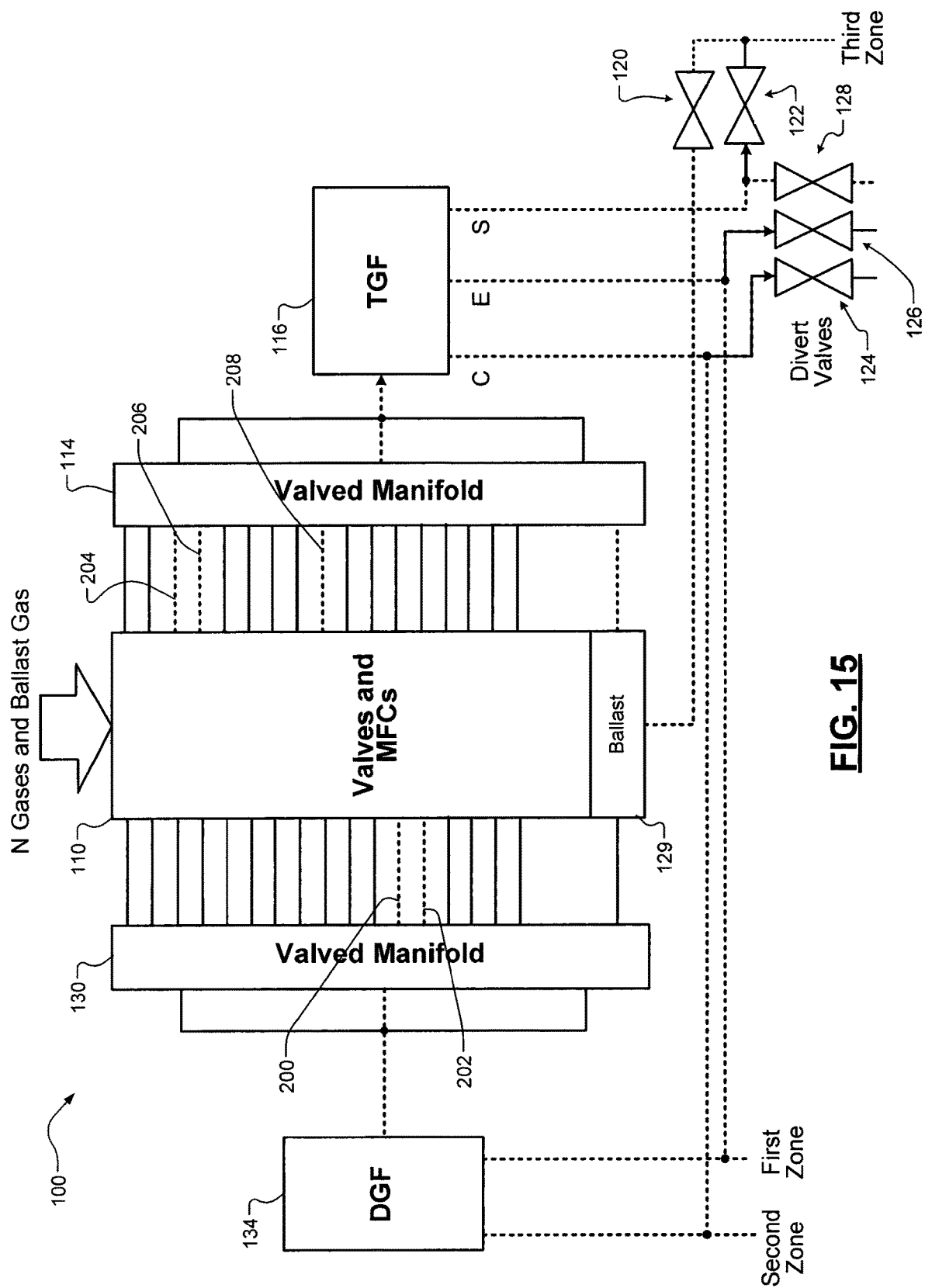

Referring now to FIG. 15, the gas delivery system may be operated using a low flow rate for tuning gas added to the main process gas and without tuning gas delivery to side tuning gas locations. In this example, the divert valve 128 is open to vacuum and the valve 122 is closed. Ballast gas may optionally be supplied (or nothing) to the side tuning gas locations via the valve 120. In this example, choked flow conditions occur above 50 sccm. The tuning gas is supplied at 5 sccm to the first zone, 10 sccm to the second zone and 0 sccm to the third zone. The tuning gas is delivered to the TGF 116 at 50 sccm. The TGF supplies 5 sccm to the first zone, 10 sccm to the second zone and the remainder (35 sccm) is diverted to vacuum via the divert valve 128.

Figure 17:
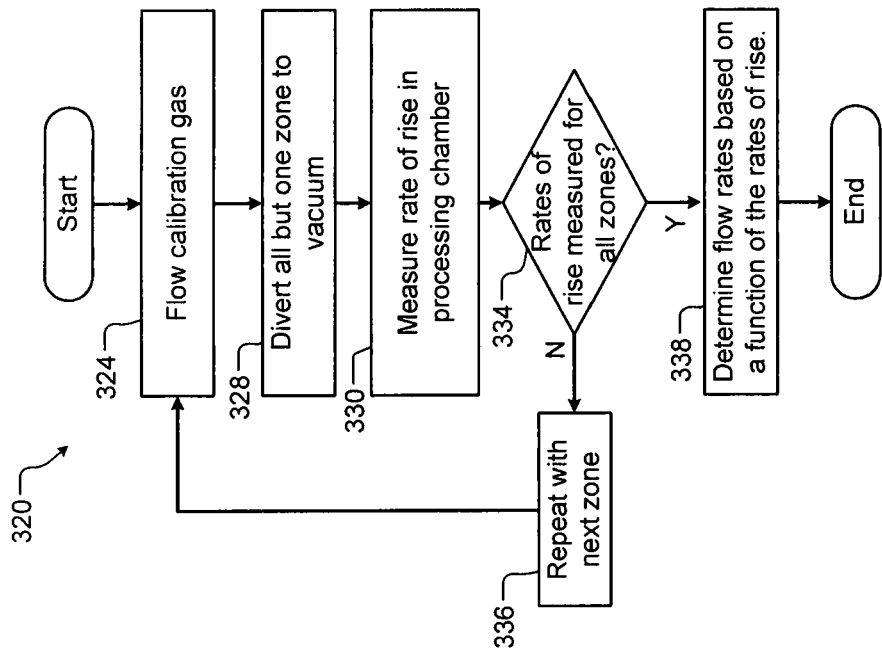
Figure 16:
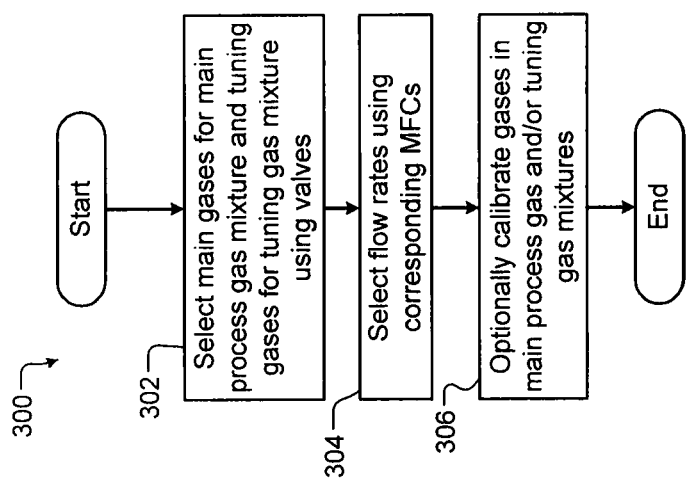

Referring now to FIGS. 16-18, various methods for operating the gas delivery system are shown. In FIG. 16, a method 300 for supplying and calibrating main process gas and tuning gas mixtures is shown. At 302, main gases for the main process gas and tuning gases for the tuning gas mixtures are selected using corresponding valves. At 304, flow rates are selected using corresponding mass flow controllers. At 306, the flow rates of the gases are optionally calibrated.

During calibration, a single calibration gas (FIG. 17) or more than one gas (FIG. 18) may be used. A nominal flow ratio is selected using the DGF or TGF. While flowing a calibration gas at a known rate into the inlet of the gas splitter, the gas split is calibrated as follows. All but one zone of the two or three output zones are diverted to vacuum. The rate of rise is determined due to gas flowing from the remaining zone. The process is repeated for the other zones.

Calibrated split ratios are calculated by dividing the individual rates of rise by the sum of the rates of rise. The process is repeated for another desired split ratio until all desired calibrations have been performed. In order to check that the measurements are being performed in choked conditions, calibration tests are run with multiple incoming gas flow rates. If the ratio results agree, then both conditions were choked.

In FIG. 17, a method 324 for calibrating main or tuning gas mixtures using a calibration gas is shown. At 324, calibration gas is supplied. At 328, all of the zones except for one are diverted to vacuum. At 330, the rate of rise in pressure in the processing chamber is measured for the zone. At 334, the method determines whether all of the rates of rise for the zones have been measured. If not, the method is repeated for remaining zones at 336. Otherwise, the method determines flow rates based on a function of the rates of rise at 338.

In FIG. 18, a method 340 for calibrating main or tuning gas mixtures using multiple gases is shown. At 341, two or more gases are supplied for a desired gas mixture. At 342, all but one of the gases are diverted to vacuum. At 343, the rate of rise in pressure in the processing chamber is measured for the remaining gas. At 344, the method determines whether all of the rates of rise for the two or more gases have been measured. If not, the method is repeated for remaining ones of the two or more gases at 345. Otherwise, the method determines flow rates based on a function of the rates of rise at 346.

Referring now to FIG. 19, a method 350 selectively supplies ballast gas to the tuning gas manifold under certain conditions. At 354, the method determines whether the flow rate of the tuning gas mixture is less than or equal to a flow rate threshold ($FR_{TH}$). If 354 is true, the method supplies ballast gas to the tuning gas manifold at 358.

Figure 20:
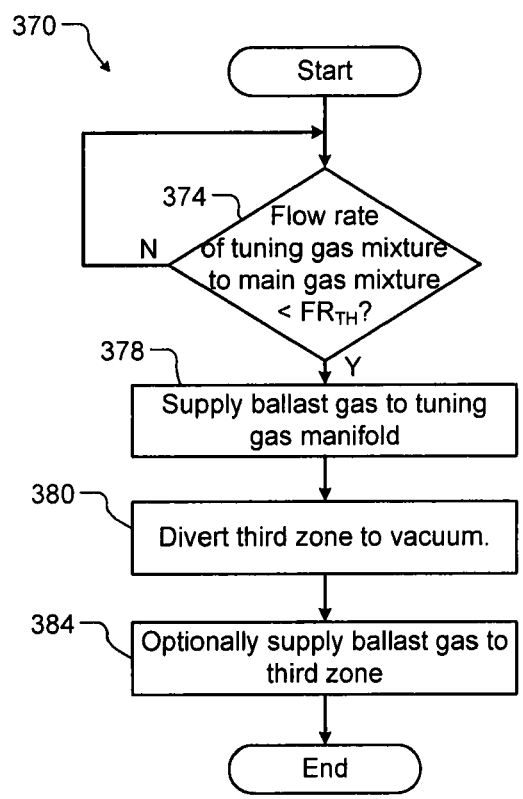

Referring now to FIG. 20, a method 370 selectively supplies ballast gas to the tuning gas manifold under other conditions. At 374, the method determines whether the flow rate of the tuning gas mixture to be added to the main gas mixture is less than or equal to a flow rate threshold ($FR_{TH}$). If 374 is true, ballast gas is supplied to the tuning gas manifold. At 380, tuning gas normally supplied to the third zone (such as the side tuning gas) is diverted to vacuum. At 384, ballast gas is optionally supplied to the third zone independently of the diverted gas.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A gas delivery system for a substrate processing system, comprising:

a first manifold comprising a plurality of manifolds;
a second manifold comprising a Q-to-R manifold and a R-to-1 manifold, wherein the Q-to-R manifold supplies the R-to-1 manifold, where Q and R are integers greater than 1;
a gas delivery sub-system configured to selectively deliver N gases from N gas sources and deliver a first gas mixture including P of the N gases to the first manifold while delivering a second gas mixture including Q of the N gases to the second manifold, where N, P and Q are integers, where P plus Q is less than or equal to N, and where N is greater than two,
wherein
the plurality of manifolds of the first manifold comprises a mixing manifold in fluid communication with the gas delivery sub-system and a valved manifold in fluid communication with the mixing manifold,
the mixing manifold comprises a plurality of outputs, receives P of the N gases, and supplies the valved manifold,
the first manifold outputs a main process gas including the first gas mixture, and
the second manifold outputs a tuning gas including the second gas mixture:
a gas splitter including
an inlet in fluid communication with an outlet of the R-to-1 manifold to receive the second gas mixture from the second manifold,
a first outlet in fluid communication with an outlet of the first manifold, and
a second outlet,
wherein
the gas splitter splits the second gas mixture into a first portion at a first flow rate that is output to the first outlet of the gas splitter and a second portion at a second flow rate that is output to the second outlet of the gas splitter,
a first zone of the substrate processing system is in fluid communication with the first outlet of the gas splitter and a second zone of the substrate processing system is in fluid communication with the second outlet of the gas splitter, and
the first manifold supplies the first gas mixture to the first zone while the second manifold supplies the second gas mixture to the second zone;
a ballast gas source;
a first valve in communication with the ballast gas source to selectively supply ballast gas to the second manifold; and
a second valve in fluid communication with the ballast gas source to selectively supply ballast gas to the second outlet of the gas splitter,
wherein the ballast gas supplied by the first valve and the ballast gas supplied by the second valve do not include a tuning gas.

2. The gas delivery system of claim 1, wherein the gas delivery sub-system includes N gas channels each including:
a first valve including an inlet in fluid communication with one of the N gas sources;
a mass flow controller including an inlet in fluid communication with an outlet of the first valve;
a second valve including an inlet in fluid communication with an outlet of the mass flow controller and an outlet in selective fluid communication with the first manifold; and
a third valve including an outlet in fluid communication with the outlet of the mass flow controller and an outlet in selective fluid communication with the second manifold.

3. The gas delivery system of claim 1, wherein the first valve supplies the ballast gas to the second manifold when a flow rate of the second gas mixture is insufficient to create a choked flow condition through the gas splitter.

4. The gas delivery system of claim 1, wherein the gas splitter includes:
M valves; and
M restricted orifices in communication with a corresponding one of the M valves.

5. The gas delivery system of claim 4, wherein at least two of the M restricted orifices have different orifice sizes.

6. A substrate processing system comprising:
the gas delivery system of claim 1;
a processing chamber;
a substrate support arranged in the processing chamber;
a first injector arranged at a first location of the processing chamber, wherein the first injector corresponds to the first zone; and
a second injector arranged at a second location of the processing chamber spaced from the first location, wherein the second injector corresponds to the second zone.

7. The substrate processing system of claim 6, wherein the processing chamber includes a dielectric window, and wherein the first injector is arranged in an opening of the dielectric window.

8. The substrate processing system of claim 6, wherein the processing chamber includes side walls, and wherein the second injector is arranged on at least one of the side walls.

9. The substrate processing system of claim 6, further comprising:
a first valve including an inlet in fluid communication with the first outlet of the gas splitter and an outlet in fluid communication with vacuum; and
a second valve including an inlet in fluid communication with the second outlet of the gas splitter and an outlet in fluid communication with vacuum.

10. The substrate processing system of claim 9, further comprising a controller to calculate relative flow rates of the first portion of the second gas mixture and the second portion of the second gas mixture.

11. The substrate processing system of claim 10, further comprising a pressure sensor that is arranged in the processing chamber and that communicates with the controller, wherein the controller calculates the relative flow rates of the first portion of the second gas mixture and the second portion of the second gas mixture by:
opening the first valve to vacuum and closing the second valve to vacuum;
measuring a rate of rise in pressure of the first portion of one of a calibration gas or the second gas mixture in the processing chamber;
opening the second valve to vacuum and closing the first valve to vacuum; and
measuring a rate of rise in pressure of the second portion of the one of the calibration gas or the second gas mixture in the processing chamber.

12. The gas delivery system of claim 1, wherein the first manifold supplies the first gas mixture to the first zone while the gas splitter supplies the second gas mixture to both the first zone and the second zone.

13. The gas delivery system of claim 1, wherein:
the first zone includes a center of a substrate and an edge of the substrate; and
the second zone includes sidewalls of a processing chamber.

14. The gas delivery system of claim 1, further comprising a controller, wherein:
the controller is configured to (i) determine whether a first condition exists or a second condition exists, and (ii) based on whether the first condition or the second condition exists, control supply of the ballast gas;
the first condition exists when a flow rate of the second gas mixture through a restricted orifice of the gas splitter is insufficient to create a choked flow condition through the gas splitter; and
the second condition exists when a drop in a gas pressure across the restricted orifice is such that a choked flow condition exists at the restricted orifice.

15. The gas delivery system of claim 1, wherein the gas delivery sub-system is configured to selectively deliver one or more of the N gases to both the first manifold and the second manifold.

16. The gas delivery system of claim 1, wherein the gas delivery sub-system is configured to selectively deliver two or more of the N gases to both the first manifold and the second manifold.

17. The gas delivery system of claim 1, wherein the gas delivery sub-system is configured to selectively deliver three or more of the N gases to both the first manifold and the second manifold.

18. The gas delivery system of claim 1, wherein:
the first manifold comprises a plurality of inlets; and
the second manifold comprises a plurality of inlets.

19. The gas delivery system of claim 1, wherein Q is two or more and P is two or more.

20. The gas delivery system of claim 1, wherein Q is three or more and P is three or more.

21. The gas delivery system of claim 1, wherein:
the second valve is in fluid communication with the ballast gas source via a gas line; and
the gas line bypasses the second manifold and gas splitter.

22. The gas delivery system of claim 1, wherein:
the ballast gas source is distinct from the gas delivery sub-system; and
ballast gas output from the second valve is not received at an input of the second manifold.

23. The gas delivery system of claim 1, wherein the ballast gas is supplied from the second valve to the second outlet of the gas splitter bypassing the second manifold and the gas splitter.

24. The gas delivery system of claim 1, further comprising a conduit connected to the second valve and the second outlet of the gas splitter and supplying the ballast gas from the second valve to the second outlet of the gas splitter.

25. The gas delivery system of claim 1, wherein the ballast gas is helium.

26. The gas delivery system of claim 1, wherein an output of the second valve is supplied directly to the second outlet of the gas splitter.

27. The gas delivery system of claim 1, wherein the ballast gas out of the second valve bypasses the first manifold.

28. A gas delivery system for a substrate processing system, comprising:
a first manifold;
a second manifold;
a gas delivery sub-system configured to selectively deliver N gases from N gas sources and deliver a first gas mixture including P of the N gases to the first manifold while delivering a second gas mixture including Q of the N gases to the second manifold, where N, P and Q are integers, where P plus Q is less than or equal to N, and where N is greater than two, and wherein the second gas mixture includes a tuning gas;
a first gas splitter including an inlet; a first outlet and a second outlet, wherein the inlet of the first gas splitter is in fluid communication with an outlet of the first manifold to receive the first gas mixture from the first manifold, wherein the first gas splitter splits the first gas mixture into a first portion that is output to the first outlet of the first gas splitter; and a second portion that is output to the second outlet of the first gas splitter;
a second gas splitter including an inlet, a first outlet, a second outlet, and a third outlet, wherein the inlet of the second gas splitter is in fluid communication with an outlet of the second manifold to receive the second gas mixture from the second manifold; and
a controller,
wherein
the second gas splitter splits the second gas mixture into a first portion that is output to the first outlet of the second gas splitter, a second portion that is output to the second outlet of the second gas splitter, and a third portion that is output to the third outlet of the first gas splitter,
a first zone of the substrate processing system is in fluid communication with the first outlet of the first gas splitter and the first outlet of the second gas splitter,
a second zone of the substrate processing system is in fluid communication with the second outlet of the first gas splitter and the second outlet of the second gas splitter,
a third zone of the substrate processing system is in fluid communication with the third outlet of the second gas splitter, and
the first gas splitter supplies the first gas mixture to the first zone while the second gas splitter supplies the second gas mixture to the second zone
the controller is configured to (i) determine whether a first condition exists or a second condition exists, and (ii) based on whether the first condition or the second condition exists, control supply of a ballast gas,
the first condition exists when a flow rate of the first gas mixture through a restricted orifice of the first gas splitter is insufficient to create a choked flow condition through the first gas splitter,
the second condition exists when a drop in a gas pressure across the restricted orifice is such that a choked flow condition exists at the restricted orifice, and
the controller is configured to, when a choked flow condition does not exist at the restricted orifice, add ballast gas to the tuning gas in the first manifold to increase the flow rate of the first gas mixture and create a choked flow condition at the restricted orifice.

29. The gas delivery system of claim 28, wherein the gas delivery sub-system includes N gas channels each including:
a first valve;
a mass flow controller including an inlet in fluid communication with an outlet of the first valve;

a second valve including an inlet in fluid communication with an outlet of the mass flow controller and an outlet in selective fluid communication with the first manifold; and a third valve including an inlet in fluid communication with the outlet of the mass flow controller and an outlet in selective fluid communication with the second manifold.

30. The gas delivery system of claim 28, further comprising:
a ballast gas source;
a first valve in fluid communication with the ballast gas source to selectively supply ballast gas to the first manifold; and
a second valve in fluid communication with the ballast gas source to selectively supply ballast gas to the second manifold.

31. The gas delivery system of claim 30, wherein the second valve supplies the ballast gas to the second manifold when the flow rate of the second gas mixture is insufficient to create a choked flow condition through the second gas splitter.

32. The gas delivery system of claim 28, wherein the first gas splitter includes:
M valves; and
M restricted orifices in communication with a corresponding one of the M valves.

33. The gas delivery system of claim 32, wherein at least two of the M restricted orifices have a different orifice size.

34. The gas delivery system of claim 28, further comprising:
a first valve including an inlet in fluid communication with the first outlet of the second gas splitter and an outlet in fluid communication with vacuum;
a second valve including an inlet in fluid communication with the second outlet of the second gas splitter and an outlet in fluid communication with vacuum; and
a third valve including an inlet in fluid communication with the third outlet of the second gas splitter and an outlet in fluid communication with vacuum.

35. The gas delivery system of claim 34, further comprising a fourth valve including an inlet in fluid communication with the third outlet of the second gas splitter and an outlet in fluid communication with the third zone.

36. The gas delivery system of claim 35, wherein the controller is configured to close the first valve, the second valve and the fourth valve and to divert a first portion of the second gas mixture to vacuum when flow rates of a second portion of the second gas mixture and a third portion of the second gas mixture are insufficient to create a choked flow condition through the second gas splitter.

37. A substrate processing system comprising:
the gas delivery system of claim 28;
a processing chamber;
a substrate support arranged in the processing chamber;
a first injector arranged at a first location of the processing chamber and including a center injector and a side injector, wherein the center injector corresponds to the first zone and the side injector corresponds to the second zone; and
a second injector arranged at a second location of the processing chamber spaced from the first location, wherein the second injector corresponds to the third zone.

38. The substrate processing system of claim 37, wherein the processing chamber includes a dielectric window, and wherein the first injector is arranged in a cavity in the dielectric window.

39. The substrate processing system of claim 37, wherein the processing chamber includes side walls, and wherein the second injector is arranged on at least one of the side walls.

40. The gas delivery system of claim 37, further comprising:
a first valve including an inlet in fluid communication with the first outlet of the second gas splitter and an outlet in fluid communication with vacuum;
a second valve including an inlet in fluid communication with the second outlet of the second gas splitter and an outlet in fluid communication with vacuum; and
a third valve including an inlet in fluid communication with the third outlet of the second gas splitter and an outlet in fluid communication with vacuum.

41. The gas delivery system of claim 40, wherein the controller is to calculate relative flow rates of the first portion of the second gas mixture, the second portion of the second gas mixture and the third portion of the second gas mixture.

42. The substrate processing system of claim 41, further comprising a pressure sensor that is arranged in the processing chamber and that communicates with the controller, wherein the controller calculates the relative flow rates of the first portion of the second gas mixture, the second portion of the second gas mixture and the third portion of the second gas mixture by:
opening the second valve and the third valve to vacuum;
closing the first valve to vacuum;
measuring a first rate of rise in pressure of the first portion of one of a calibration gas or the second gas mixture in the processing chamber;
opening the first valve and the third valve to vacuum;
closing the second valve to vacuum;
measuring a second rate of rise in pressure of the second portion of the one of the calibration gas or the second gas mixture in the processing chamber;
opening the first valve and the second valve to vacuum;
closing the third valve to vacuum; and
measuring a third rate of rise in pressure of the third portion of the one of the calibration gas or the second gas mixture in the processing chamber.

43. The substrate processing system of claim 42, wherein the controller determines relative flow rates of the first portion of the second gas mixture, the second portion of the second gas mixture and the third portion of the second gas mixture based on the first rate of rise, the second rate of rise and the third rate of rise.

44. The gas delivery system of claim 28, wherein the first gas splitter supplies the first gas mixture to the first zone while the second gas splitter supplies the second gas mixture to both the first zone and the second zone.

45. The gas delivery system of claim 28, wherein:
the first zone includes a center of a substrate;
the second zone includes an edge of the substrate; and
the third zone includes sidewalls of a processing chamber.

46. The gas delivery system of claim 28, wherein the controller is configured to supply the ballast gas to the first manifold to create a choked flow condition at the restricted orifice of the first gas splitter.

47. The gas delivery system of claim 28, further comprising a supply valve, wherein:
the gas delivery system includes a plurality of mass flow controllers and a plurality of valves; and the controller is configured to, based on whether the first condition exists or the second condition exists, control the supply valve to supply the ballast gas to the first manifold bypassing the plurality of mass flow controllers and plurality of valves.

48. The gas delivery system of claim 28, wherein the ballast gas is supplied to the first manifold without being supplied first to a mass flow controller upstream from the first manifold.

49. A gas delivery system for a substrate processing system, comprising:
a first manifold;
a second manifold;
a gas delivery sub-system configured to selectively deliver N gases from N gas sources and deliver a first gas mixture including P of the N gases to the first manifold while delivering a second gas mixture including Q of the N gases to the second manifold, where N, P and Q are integers, where P plus Q is less than or equal to N, and where N is greater than two;
a first gas splitter including an inlet, a first outlet and a second outlet, wherein the inlet of the first gas splitter is in fluid communication with an outlet of the first manifold to receive the first gas mixture from the first manifold, wherein the first gas splitter splits the first gas mixture into a first portion that is output to the first outlet of the first gas splitter, and a second portion that is output to the second outlet of the first gas splitter;
a second gas splitter including an inlet, a first outlet, a second outlet, and a third outlet, wherein the inlet of the second gas splitter is in fluid communication with an outlet of the second manifold to receive the second gas mixture from the second manifold;
injectors configured to inject the second gas mixture into a processing chamber;
sidewall injection ports configured to inject the second gas mixture at sidewalls of the processing chamber; and
a controller configured to control the gas delivery sub-system such that the first splitter supplies the first gas mixture to a first zone of the processing chamber while the second splitter supplies the second gas mixture to a first zone, a second zone, and a third zone of the processing chamber,
wherein
the second gas splitter splits the second gas mixture into a first portion that is output to the first outlet of the second gas splitter, a second portion that is output to the second outlet of the second gas splitter, and a third portion that is output to the third outlet of the second gas splitter,
the first zone is in fluid communication with the first outlet of the first gas splitter and the first outlet of the second gas splitter,
the second zone is in fluid communication with the second outlet of the first gas splitter and the second outlet of the second gas splitter,
the third zone is in fluid communication with the third outlet of the second gas splitter,
the first gas splitter supplies the first gas mixture to the first zone while the second gas splitter supplies the second gas mixture to the second zone,
the first gas splitter supplies the first gas mixture to the first zone while the second gas splitter supplies the second gas mixture to the first zone, the second zone and the third zone,
the first zone includes a center of a substrate,
the second zone includes an edge of the substrate,
the third zone includes the sidewalls of the processing chamber, the injectors are configured to direct the second gas mixture in directions towards the center of the substrate and the edge of the substrate, the sidewall injection ports are configured to direct the second gas mixture in directions towards the sidewalls of the processing chamber, and
the second gas mixture is provided via the third outlet of the second gas splitter to the sidewall injection ports at one or more injection locations in the sidewalls.

50. The gas delivery system of claim 49, wherein:
the second gas mixture includes a ballast gas; and
the gas delivery sub-system supplies the ballast gas (i) the first manifold and to the second manifold, and (ii) to the third zone.

51. The gas delivery system of claim 50, wherein the ballast gas is helium.

52. The gas delivery system of claim 50, wherein the gas delivery sub-system supplies the ballast gas directly to the third zone bypassing the first manifold, the first gas splitter, the second manifold and the second gas splitter.

53. The gas delivery system of claim 49, further comprising the processing chamber including the sidewalls with the sidewall injection ports.

54. The gas delivery system of claim 53, wherein outputs of the splitter are supplied directly to the injectors.

55. A gas delivery system for a substrate processing system, comprising:
a first manifold comprising a plurality of manifolds;
a second manifold comprising a Q-to-R manifold and a R-to-1 manifold, wherein the Q-to-R manifold supplies the R-to-1 manifold, where Q and R are integers greater than 1;
a gas delivery sub-system configured to selectively deliver N gases from N gas sources and deliver a first gas mixture including P of the N gases to the first manifold while delivering a second gas mixture including Q of the N gases to the second manifold, where N, P and Q are integers, where P plus Q is less than or equal to N, and where N is greater than two;
a gas splitter including
an inlet in fluid communication with an outlet of the R-to-1 manifold to receive the second gas mixture from the second manifold,
a first outlet in fluid communication with an outlet of the first manifold, and
a second outlet,
wherein
the gas splitter splits the second gas mixture into a first portion at a first flow rate that is output to the first outlet of the gas splitter and a second portion at a second flow rate that is output to the second outlet of the gas splitter,
a first zone of the substrate processing system is in fluid communication with the first outlet of the gas splitter and a second zone of the substrate processing system is in fluid communication with the second outlet of the gas splitter, and
the first manifold supplies the first gas mixture to the first zone while the second manifold supplies the second gas mixture to the second zone;
a ballast gas source;
a first valve in communication with the ballast gas source to selectively supply ballast gas to the second manifold; and a second valve in fluid communication with the ballast gas source to selectively supply ballast gas to the second outlet of the gas splitter,
wherein
the ballast gas supplied by the first valve and the ballast gas supplied by the second valve do not include a tuning gas, and
an output of the second valve is supplied directly from the second valve to the second outlet of the gas splitter.

* * * * *